US009916105B1

(12) United States Patent
Asnaashari

(10) Patent No.: US 9,916,105 B1
(45) Date of Patent: Mar. 13, 2018

(54) PAGE MANAGEMENT FOR DATA OPERATIONS UTILIZING A MEMORY DEVICE

(71) Applicant: Crossbar, Inc., Santa Clara, CA (US)

(72) Inventor: Mehdi Asnaashari, Danville, CA (US)

(73) Assignee: CROSSBAR, INC., Santa Clara, CA (US)

( * ) Notice: Subject to any disclaimer, the term of this patent is extended or adjusted under 35 U.S.C. 154(b) by 7 days.

(21) Appl. No.: 14/933,032

(22) Filed: Nov. 5, 2015

(51) Int. Cl.
  *G06F 3/06* (2006.01)
  *G06F 12/08* (2016.01)
  *G06F 12/0802* (2016.01)

(52) U.S. Cl.
  CPC .......... *G06F 3/0629* (2013.01); *G06F 3/0604* (2013.01); *G06F 3/0679* (2013.01); *G06F 12/0802* (2013.01); *G06F 2212/2024* (2013.01); *G06F 2212/601* (2013.01)

(58) Field of Classification Search
  CPC .... G06F 3/0629; G06F 3/0604; G06F 3/0679; G06F 2212/2024; G06F 2212/601; G06F 12/0804; G06F 12/0802
  See application file for complete search history.

(56) References Cited

U.S. PATENT DOCUMENTS

| | | | | |
|---|---|---|---|---|
| 5,463,759 A | * | 10/1995 | Ghosh | G06F 12/0891 711/105 |
| 6,374,334 B1 | * | 4/2002 | Suga | G06F 9/3824 710/244 |
| 8,402,226 B1 | * | 3/2013 | Faibish | G06F 12/0804 710/52 |
| 9,093,635 B2 | * | 7/2015 | Kim | H01L 45/06 |
| 9,471,417 B1 | * | 10/2016 | Asnaashari | G06F 11/1008 |
| 9,536,582 B2 | * | 1/2017 | Tanzawa | G11C 8/12 |
| 2001/0036325 A1 | * | 11/2001 | Hashimoto | H04N 1/00249 382/312 |
| 2009/0106013 A1 | * | 4/2009 | Norman | G06F 13/1694 703/23 |
| 2009/0196103 A1 | * | 8/2009 | Kim | G11C 8/08 365/185.12 |
| 2013/0013825 A1 | * | 1/2013 | Muto | G06F 1/3253 710/56 |
| 2016/0225442 A1 | * | 8/2016 | Asnaashari | G11C 13/0069 |

* cited by examiner

*Primary Examiner* — Mano Padmanabhan
*Assistant Examiner* — Patrick Borges
(74) *Attorney, Agent, or Firm* — Amin, Turocy & Watson, LLP

(57) ABSTRACT

Providing for a memory apparatus configured for improved data management for a two-terminal memory array is described herein. By way of example, disclosed embodiments relate to page management and transfer of data between page-sized subsets of a page buffer, and respective pages within one or more memory banks of the two-terminal memory array. The memory apparatus can emulate a larger page size than a physical page buffer utilized by the memory apparatus, to provide compatibility with different page size defaults while lowering current consumption by the page buffer. This can facilitate large or small array operations, taking advantage of higher efficiencies of two-terminal memory devices. In addition, page buffer data management can facilitate interleaved data transfers among multiple banks of memory, facilitating large memory capacities for a disclosed memory apparatus.

20 Claims, 17 Drawing Sheets

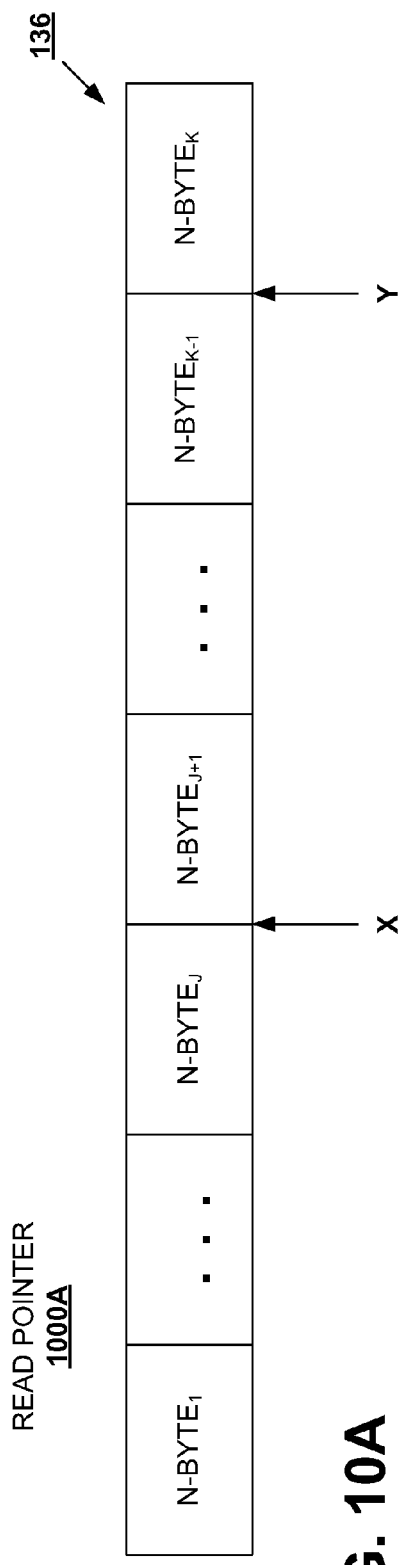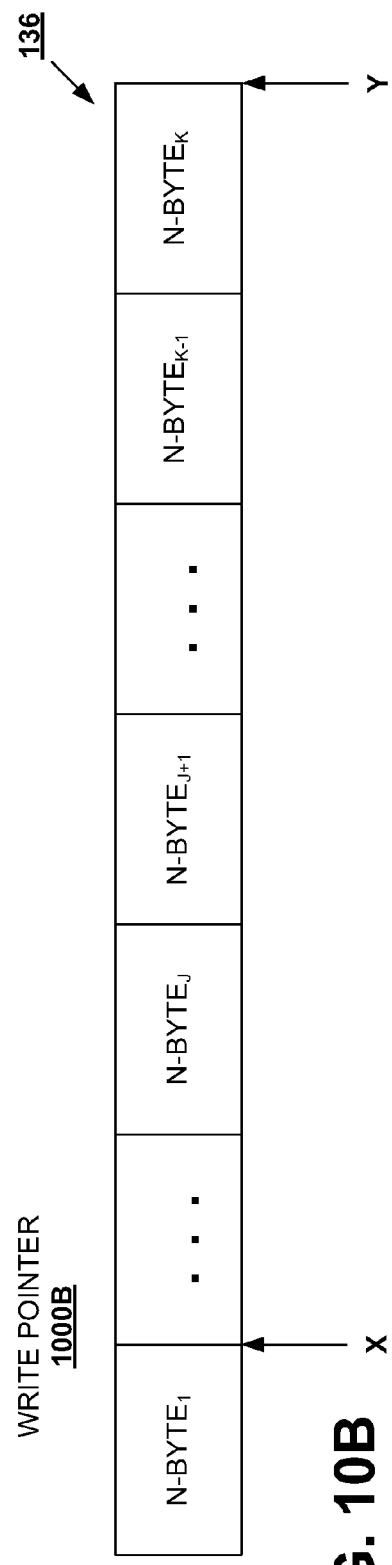

PAGE MANAGEMENT FOR DATA OPERATIONS UTILIZING A MEMORY DEVICE

TECHNICAL FIELD

This disclosure relates generally to electronic memory; as one example, the disclosure describes an electronic memory comprising multiple banks of non-volatile memory with a high-speed interface and expanded command and address bus.

BACKGROUND

A recent innovation within the field of integrated circuit technology is two-terminal memory technology. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the present disclosure provide for data operation management for a memory device. In example embodiments, the memory device can be a non-volatile memory having relatively small page size for reduced current consumption and improved operational efficiency. Data management can include coordinating data transfers from a multi-page buffer to respective pages in memory, queuing data received from a host, facilitating compatibility between disparate host and memory page-size configurations, or the like.

In further embodiments, data operation management can include programmable configurations to marry data size configurations of a host device with page and buffer dimensions of a memory device. Configuration registers can be provided to facilitate programmable configuration of the memory device. Example configurable parameters can include shift times, transfer times, memory page size, page buffer size, and so forth. According to some embodiments, configuration parameters can include read or writer pointers to facilitate integrative or interleaved data operations. In still other embodiments, the configuration parameters can include an emulation page size, to facilitate compatibility with a host that is programmed for a memory device having a different page size than one or more disclosed memory devices.

According to still other embodiments, disclosed data management can incorporate a memory array comprising multiple memory banks. Data written to a page buffer can be interleaved among multiple banks from separate page-sized subsets of the page buffer. Likewise, pages of data read from multiple memory banks can be transferred to respective subsets of the page buffer, and aggregated when output to a host device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIGS. 10A and 10B illustrate block diagrams of example read and write pointers facilitating aggregated data management, in still other embodiments;

DETAILED DESCRIPTION

The present disclosure relates to data management operations for a non-volatile memory device. Generally, disclosed embodiments relate to page management and transfer of data between page-sized subsets of a page buffer, and respective pages within one or more memory banks of memory. Data transfer can include write operations, where data is received from a host, written to the page buffer, and transferred to pages of a memory device for storage, or read operations where data is transferred from one or more pages of memory of the memory device to the page buffer and then to the host.

In some embodiments, disclosed data management operations can include emulation of different page sizes to facilitate compatibility with legacy controllers or host devices. Some disclosed memory devices can comprise an array (whether single bank or multi-bank) of non-volatile, two-terminal memory, having significant physical advantages over conventional NAND or NOR Flash memory. Further, these advantages can enable use of smaller page sizes and greatly improved data efficacy, without sacrificing throughput, power efficiency, memory density, and other important features of a memory device. Yet, because conventional Flash has dominated many electronic device applications in recent years, host devices are often configured according to conventions employed by NAND or NOR Flash, such as page size conventions. NAND page sizes can range from 8 kilo bytes (kB) to 32 kB or even more, as one example. Accordingly, emulation of different page sizes can facilitate ready integration of advanced memory device technology with legacy host devices or memory controllers.

In further embodiments, sets of programmable configuration registers are provided that facilitate device interoperability as well as precise yet flexible operation. In some embodiments, programmable configuration parameters can include transfer time, memory page size and page buffer size, to coordinate internal data transfers between a memory array and page buffer according to different access times. In further embodiments, programmable parameters can include an emulated page size, shift rate to a controller and read and write pointers for aggregating data operations, to facilitate operability with different page size paradigms.

Further to the above, multi-bank memory devices are supported in one or more embodiments. Data management for multi-bank memory devices can include interleaving buffered data among multiple banks of memory, whether output from the memory for read operations, or input to the memory for write operations. Furthermore, the subject disclosure provides alternative multi-memory bank architectures compatible with disclose data management techniques.

Figure 1:
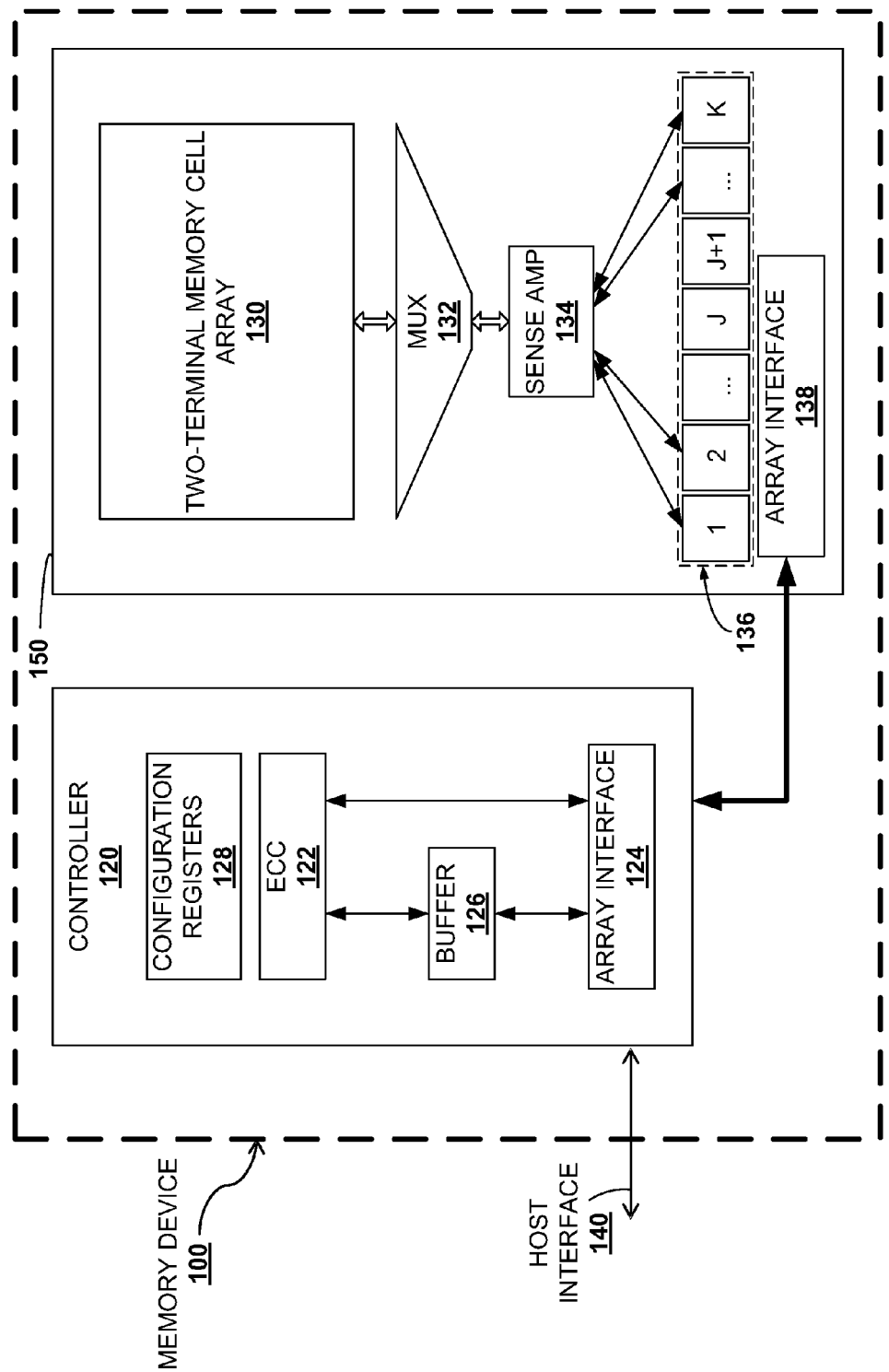
FIG. 1 illustrates a block diagram of an example memory device with improved data management for a non-volatile memory device, in disclosed embodiments.

Referring now to the drawings, FIG. 1 illustrates a block diagram of an example memory device 100 that provides improved data buffering in various embodiments. In one or more embodiments, the data buffering employed by memory device 100 can be configured to leverage physical characteristics of two-terminal memory cells employed as non-volatile storage for memory device 100. In further embodiments, memory device 100 can be configured to emulate conventional memory (e.g., to be compatible with legacy devices, such as a NAND Flash device) or can be configured to operate in a manner that maximizes the physical characteristics of the two-terminal memory cells, or a suitable combination of the foregoing.

Memory device 100 can comprise a controller 120 operable in conjunction with a non-volatile memory 150. Controller 120 can be configured to communicate with a host device over a host interface 140. Communication can include receiving data from the host device (e.g., to be written to non-volatile memory 150) or providing data to the host device (e.g., read from non-volatile memory 150), as well as receiving and acknowledging host commands. Further, controller 120 can be configured to decode the host commands, and issue array commands to non-volatile memory 150 over an array interface 124 in response to the host commands. Controller 120 can comprise a set of configuration registers 128 facilitating programmable control over characteristics of non-volatile memory 150 (e.g., see FIG. 3, infra), an error correction code (ECC) 122 component for identifying or correcting bit errors read from non-volatile memory 150, and a data buffer 126 facilitating ECC 122 operation.

Array interface 124 communicatively connects to an array interface 138 of non-volatile memory 150. Data transferred from array interface 138 to array interface 124, and out from host interface 140 is referred to herein as a shift transfer. The shift transfer involves data output by a page buffer 136 of non-volatile memory 150, which is provided to controller 120 and then to the host device. Time required to complete a shift transfer is referred to as a shift time.

When performing an array operation at two-terminal memory cell array 130, controller 120 issues a command to access a page(s) of memory (or a subset of a page of memory), and data is transferred between the accessed page(s) of memory and page buffer 136. Data transfer between page buffer 136 and two-terminal memory cell array 130 is generally referred to herein as an access transfer (or an access data transfer), and time required to complete the access transfer is referred to as an access time (or write access time, read access time, etc.). It should be appreciated that an access transfer can include data transferred from page buffer 136 and written to the page(s) (or subset of a page) of two-terminal memory cell array 130, referred to as a write operation herein, and can include data read from the page(s) (or subset thereof) of two-terminal memory cell array 130 and provided to page buffer 136, referred to herein as a read operation. Note that a set of sense amps 134 are provided to decode data stored in a page(s) of two-terminal memory cell array 130 accessed for a read operation. Additionally, a multiplexer (mux) 132 can be provided for selecting (e.g., activating) a target page(s) (or subset thereof) of memory upon which a read or write operation is to be performed, and deselecting (e.g., deactivating) the target page(s) (or subset thereof) after completion of the read or write operation.

As depicted, page buffer 136 can comprise a plurality of buffer subsets configured to respectively store an amount of data. In some embodiments, the amount of data can be equal to a page of data, matching a page-size (having N bytes of data, where N is a suitable positive integer) of two-terminal memory cell array 130. In such embodiments, a page of data received at one of the buffer subsets can be written entirely to a target page of two-terminal memory cell array 130 (e.g., see FIG. 2, infra). Likewise, data stored at the target page can be transferred entirely to a buffer subset. This arrangement can simplify page-sized transfers of data to and from non-volatile memory 150. In further embodiments, page buffer 136 can have a number, K, of buffer subsets, where K is a suitable positive integer. In additional embodiments, the number N of bytes of data in a buffer subset matches the number of bytes of data in a page of two-terminal memory cell array 130. A total physical size of page buffer 136 is given therefore by the number N of bytes per buffer subset× the number K of buffer subsets, or: Page Buffer size=N×K bytes of data.

Figure 9:
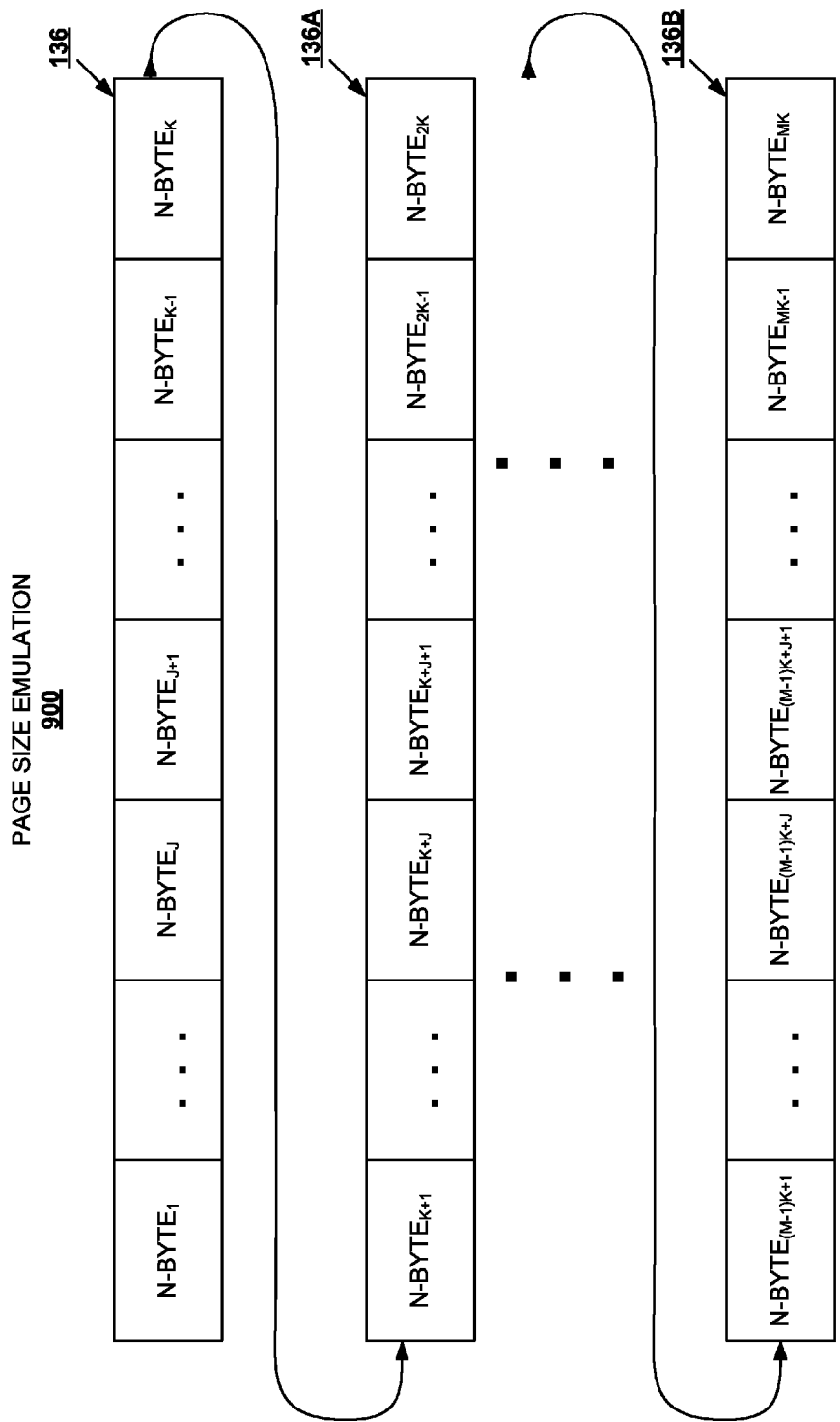
FIG. 9 illustrates a block diagram of an example page size emulation according to further embodiments.

In still other embodiments, page buffer 136 can be operated to emulate a smaller-sized buffer (e.g., a number J of buffer subsets, where J<K) or a larger-sized buffer (e.g., having a multiple, M, of K buffer subsets, M×K, where M is a suitable positive integer; see FIG. 9, infra). As an illustrative example, page buffer 136 can comprise 8 buffer subsets (K=8) each of 256 bytes (N=256) for a page buffer size of about 2 kilobytes (kB). For this example, page buffer 136 can emulate a 4 kB page buffer, by filling page buffer 136 twice (M=2) for each reported page operation (e.g., as reported to a host operating on a 4 kB page-size configuration). For M=3, a 6 kB page buffer can be emulated, for M=4 a 8 kB page buffer can be emulated, and so on. The total size in bytes of data of an emulated page buffer 136 is therefore given by: Emulated Page Buffer size=M×(N×K bytes). It should be appreciated that other examples of N bytes and K buffer subsets can be employed for page buffer 136 in addition to those specifically provided in the above example.

Two-terminal memory cell array 130 can comprise non-volatile resistive-switching memory cells, in one or more embodiments. Resistive-switching two-terminal memory cells (also referred to as resistive-switching memory cells, resistive-switching memory, resistive random access memory (RRAM), or the like), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable external stimulus applied at the conductive contacts. External stimuli can be selected to have suitable characteristics, such as a voltage or current magnitude, a voltage or current polarity, a field strength, a field polarity, or the like, or a suitable combination thereof. Examples of a resistive switching two-terminal memory device, though not exhaustive, can include a RRAM, a phase change RAM (PCRAM), a conductive-bridging RAM, a magnetic RAM (MRAM) and others. Some further examples of two-terminal memory cells that can be employed herein, though in no means complete, can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which is expressly incorporated by referenced herein in their respective entireties and for all purposes.

In further embodiments, non-volatile resistive-switching memory cells employed for disclosed memory arrays can comprise a two-terminal selector device. The two-terminal selector device can be a volatile resistive-switching device having very high on/off current ratio, thereby greatly mitigating leakage path currents in a crosspoint array and enabling higher sensing margins and greater memory densities. For instance, one transistor n resistor (1TnR, where n can be quite large) memory arrays can be provided while maintaining good sensing margins with a two-terminal selector device. An example of such a device can be found in the following U.S. patent application assigned to the assignee of the present application for patent: application Ser. No. 14/588,185 filed Dec. 31, 2014; which is incorporated by reference herein in its entirety and for all purposes.

Figure 2:
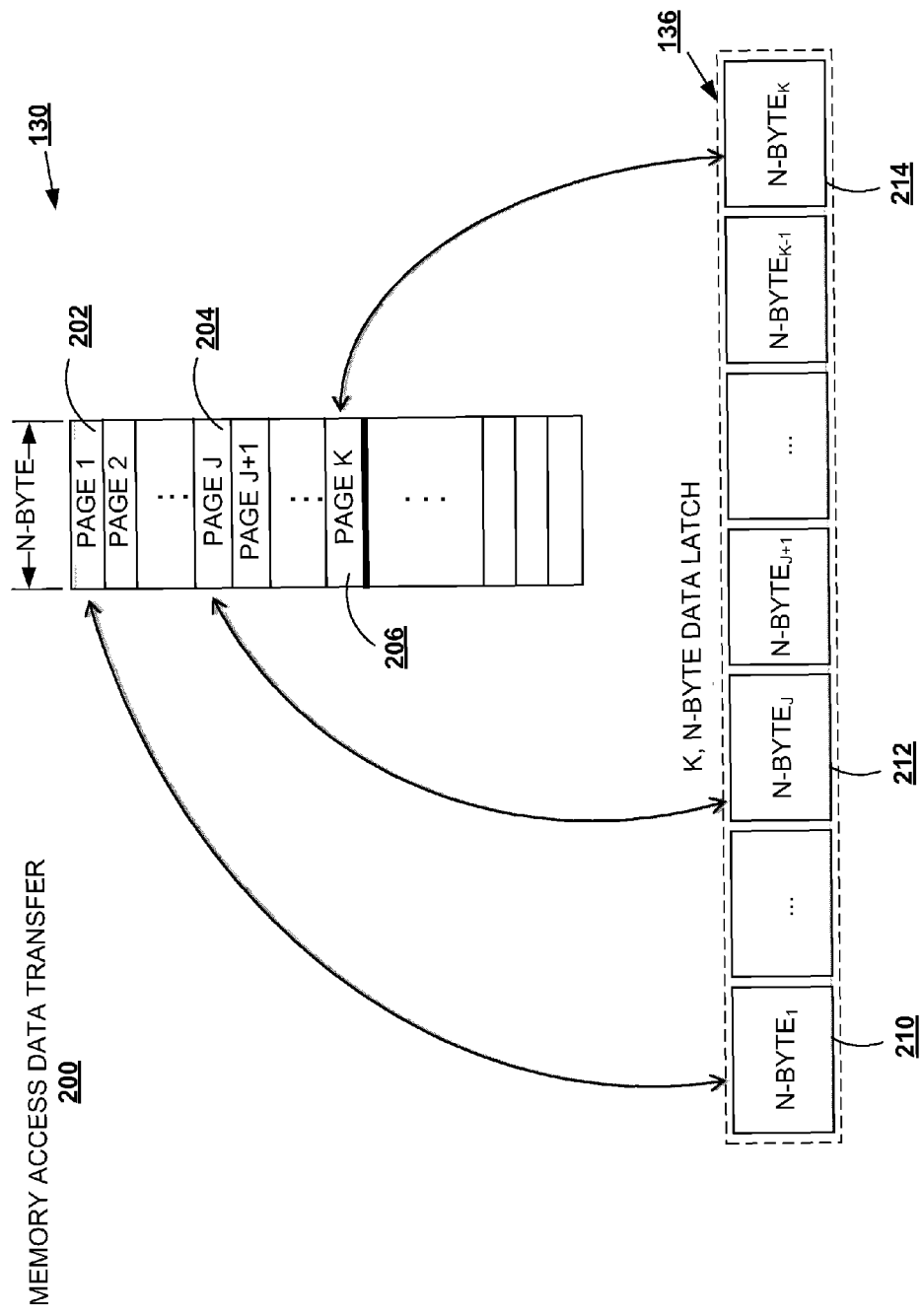
FIG. 2 depicts a block diagram of a set of pages of a memory array and transfer of data from a page buffer, in one or more embodiments.

FIG. 2 illustrates a diagram of an example access data transfer 200 for a memory device according to embodiments of the present disclosure. Memory access data transfer 200 refers to two-terminal memory cell array 130 (or other suitable memory device) depicted as a sequence of N-byte pages, and page buffer 136 having K buffer subsets. The N-byte pages are arranged in a single column matrix for purposes of this example, though two-dimensional or three-dimensional matrices can be employed for two-terminal memory cell array 130 in disclosed embodiments.

As depicted, where N is equal to a number of bytes within a page of data of two-terminal memory cell array 130, contents of respective subsets of page buffer 136 can be written to respective pages of two-terminal memory cell array 130, and vice versa. The set of buffer subsets of page buffer 136 can comprise N-byte buffer subsets, including N-byte$_1$ 210, . . . N-byte$_J$ 212 (where 1<J<K), N-byte$_{J+1}$, . . . , N-byte$_{K-1}$, N-byte$_K$ 214 (referred to collectively as buffer subsets 210-214). When writing from page buffer 136 to two-terminal memory cell array 130, contents of N-byte$_1$ 210 is written to page 1 202, contents of N-byte$_J$ 212 is written to page J 204, and so on, through the contents of N-byte$_K$ 214 written to page K 206 of two-terminal memory cell array 130. For a read operation, data stored at page 1 202, page J 204 through page K 206 can be written to respective buffer subsets 210-214 of page buffer 136 in a similar fashion.

It should be appreciated that write operations from page buffer 136 to two-terminal memory cell array 130 need not begin at page 1 202, and likewise read operations from two-terminal memory cell array 130 to page buffer 136 need not begin at page 1 202. For example, a read or write operation can start from/at page J 204 (or any other suitable page). In such case, for a write operation, N-byte$_1$ 210 can be written to page J 204, or page J 204 can be read into N-byte$_1$ 210 for a read operation, and so on.

Time required to read data from or write data to two-terminal memory cell array 130 is defined as an access time. Access time generally involves time to activate a page of two-terminal memory cell array 130, transfer data from page buffer 136 to the activated page, and deactivate the page. The duration of the access time is generally dominated by the time to transfer data between page buffer 136 and two-terminal memory cell array 130. However, total read or write operation time (also referred to as latency) can include time to shift data between page buffer 136 and a host (e.g., controller 120, or host interface 140), defined as shift time, added to the access time. Because access time includes page-specific activities, it can often be expressed in an amount of time per page, such as a read time of x microseconds (µs) per second per page of data, or x µs/page read access time (where x is a suitable read time for two-terminal memory cell array 130). Likewise, write time could be expressed as: y µs/page write access time. Read and write shift times can be expressed similarly. In some embodiments, page buffer 136 is filled with data before the data is sent out from page buffer 136 (e.g., before accessing two-terminal memory cell array 130 in a write operation, or before shifting data out from non-volatile memory 150 in a read operation). In these embodiments, total read time (of the physical page buffer 136)=read shift time+K*read access time. Likewise, total write time (of the physical page buffer 136)=write shift time+K*write access time.

In alternative or additional embodiments, data can be transferred between page buffer 136 and two-terminal memory cell array 130 before all K buffer subsets of page buffer 136 are filled with data. In this case, total operation time is substantially less than shift time+K*access time (whether read or write). This is because for at least a subset of the shift time and access time, data is shifted into/out of page buffer 136 concurrently with data being written to or read from two-terminal memory cell array 130. To ensure that valid data is available to shift out to a host (in the case of read) or write to two-terminal memory cell array 130, page buffer 136 can be filled with data from N-byte$_1$ 210 at least to N-byte$_J$ 212 prior to output of data from page buffer 136. Further, J can be selected based on a relationship of access time and shift time for a memory device 100, and for an emulated page buffer 136 where M>1, J can also be larger than K. Read and write pointers can be employed to mark which buffer subset J is set to, for a particular operation (e.g., see FIG. 10, infra). Controller 120 can calculate J separately for read operations (e.g., read pointers) and for write operations (e.g., write pointers), based on respective read/write access and shift times for two-terminal memory cell array 130 (or for a particular mode of operation for which two-terminal memory cell array 130 is configured to operate; for instance, when two-terminal memory cell array can be configured to operate at different read or write access times). J can be selected so that valid data is present in any particular one of buffer subsets 210-214 before contents of the particular one of buffer subsets 210-214 is output from page buffer 136, as one example.

Figure 3:
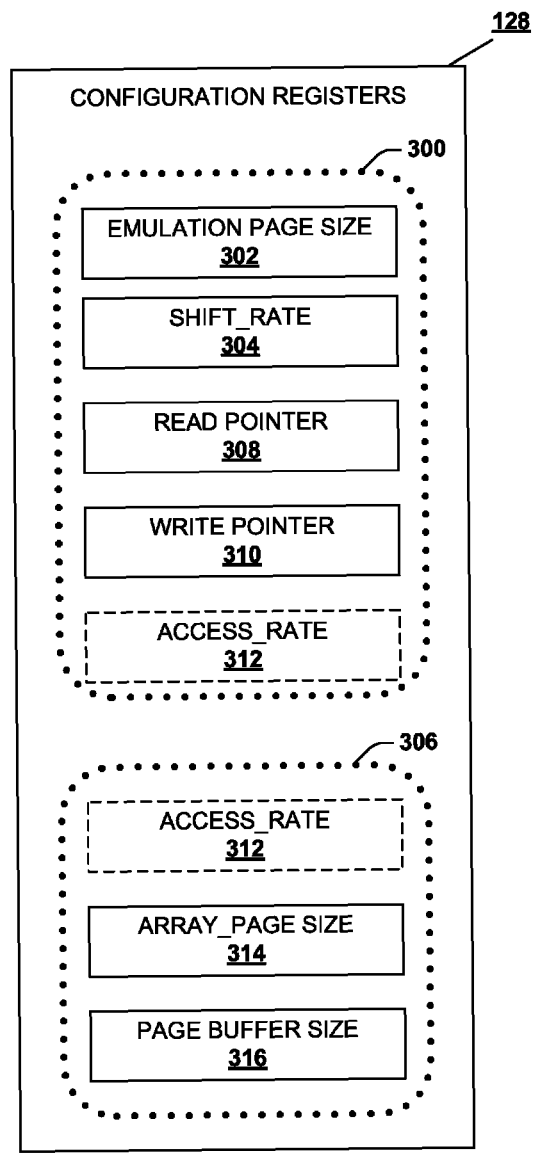
FIG. 3 depicts a block diagram of an example set of configuration registers for a disclosed memory device, in an embodiment(s)

FIG. 3 depicts a block diagram of an example set of configuration registers 128 for a memory device according to one or more embodiments of the present disclosure. Configuration registers 128 can be characterized into two groups, in an embodiment, although the subject disclosure is not so limited. For instance, configurations registers 128 can comprise a set of fixed parameter registers 306 for storing information related to fixed hardware parameters, and a set of programmable parameter registers 300 for storing information related to non-fixed operational parameters. Fixed parameter registers 306 relate to parameters that are set by hardware or other constraints of non-volatile memory device 150 and not subject to change by controller 120. In contrast, programmable parameter registers 300 include software, firmware or controllable hardware parameters, and can be configured by the controller 120 based on values of the fixed parameter registers 306 and memory usage requirements of controller 120, as one example.

Programmable parameter registers 300 can comprise an emulation page size register 302 and a shift rate register 304. These registers can have values set by controller 120 based on one or more operational settings. One example of an operational setting can include a selectable access rate mode of a set of access rate modes at which two-terminal memory cell array 130 can be programmed to operate. Programmable parameter registers 300 can be set based on this selected access rate, in conjunction with other parameters such as memory requirements, processor speed, shift rate 304 capabilities, among others. In the embodiment where two-terminal memory cell array 130 can be set to one of a set of access rate modes, access rate 312 can be a programmable parameter. In other embodiments, access rate 312 can be a fixed parameter, having only a single setting. For a particular device, access rate 312 will either be a fixed parameter register or a programmable parameter register, and thus for various devices could be in either subset (delineated by the dashed line), but for a particular device will be in only one such subset.

Emulation page size can be set to a page size for which a host device is configured, and then page-related information can be reported to the host device in the context of the emulated page size. A multiple (e.g., M) of page buffers 136 required to equal the size of the emulated page size can be utilized to translate between page buffer operations and emulated page operations. Shift rate register 304 can store a speed at which data is transferred from page buffer 136 to a host or from host to page buffer 136. The shift rate can be utilized to calculate suitable read and write pointers for implementing access operations at least in part concurrent with shift operations into and out from a common page buffer 136.

Programmable parameter registers 306 can further comprise a read pointer register 308 and a write pointer register, 310. Read pointer register 308 and write pointer register 310 can be programmed by controller 120 to values determined from suitable relationships between access time (or selected access time) and shift time of a memory device. The relationships can vary based on device or operations constraints, such as whether a host requires a full page to be shifted at a time, or whether ready/busy capability can be employed to shift subsets of a page to the host (e.g., see FIG. 15, infra). One example relationship for a read operation is as follows:

$$(K - J) * \text{access time} <= (K - 1) * \text{shift time}. \quad (1)$$

J can be expressed as a number of buffer subsets >=

$$K - \frac{(K - 1) * \text{shift\_time}}{\text{access\_time}}$$

As an illustrative example, for a shift time of 1.25 µs, access time of 2 µs and K=9 total page buffer subsets, data can be shifted out from non-volatile memory 150 after:

9−(9−1)*1.25/2, or 4 buffer subsets. Shifting data out from page buffer 136 after a 4$^{th}$ buffer subset is filled, rather than waiting for the entire page buffer to be filled with data, can reduce read latency from 9 µs to 4 µs.

For writing data to two-terminal memory cell array 130, particularly where shift time is faster than access time, data can be written from page buffer 136 to page 1 202 as soon as N-byte$_1$ 210 is full. In this case no need for identifying a particular N-byte$_J$ 212 is required. Where shift time is slower than access time, J can be determined similarly for write operations as for read operations, above. Where no larger page size emulation is employed, write pointer 310 can be ignored.

When emulating a larger page buffer size, in one embodiment, write pointer 310 can be set to a buffer subset, J, within a subsequent emulated page (e.g., M=2) to which data can be continuously shifted (e.g., starting at n-Byte$_1$ 210 of a first emulated page; M=1), without overwriting data that has yet to be written to two-terminal memory cell array 130. This assumes that data in the first emulated page, starting with n-Byte$_1$ 210, is written to two-terminal memory cell array 130 as soon as n-Byte$_1$ 210 is full. Once data is shifted into n-Byte$_K$ 214, the host can continue shifting data into page buffer 136 starting again at n-Byte$_1$ 210 (e.g., wrapping around to the first buffer subset), up to n-Byte$_J$ 212. This can facilitate reduced write latency. To emulate a page size of M*K:

$$(M * K - J) * \text{access time} <= (2K - 1) * \text{shift time.} \quad (2)$$

In this case, J can be expressed as follows:

$$J >= M * K - \frac{(M * K - 1) * \text{transfer\_time}}{\text{access\_time}}$$

To extend the previous example's parameters, K=9, transfer time=1.25 µs, access time=2 µs, and for an emulation multiple M=2:

J>=(2)*(9)−(2*9−1)*1.25/2=7.375, or rounded up to the nearest whole buffer subset number J=8. Accordingly, a new host page can begin loading into n-Byte$_1$ 210 following writing data from n-Byte$_8$ into two-terminal memory cell array 130, reducing write latency by a small percentage.

Configuration registers 128 can also comprise fixed parameter registers 306. In some embodiments, fixed parameter registers 306 can comprise access rate register 312, as described above for example. The access rate parameter refers to a value representing speed with which data can be written from page buffer 136 to two-terminal memory cell array 130. Likewise, fixed parameter registers 306 can comprise an array page size register 314 that stores a number of bytes (or bits) per page, and page buffer size 316 can store a value of N, indicating the number of bytes per page, or a value of K, indicating the number of buffer subsets in page buffer 136, or both.

Figure 4:
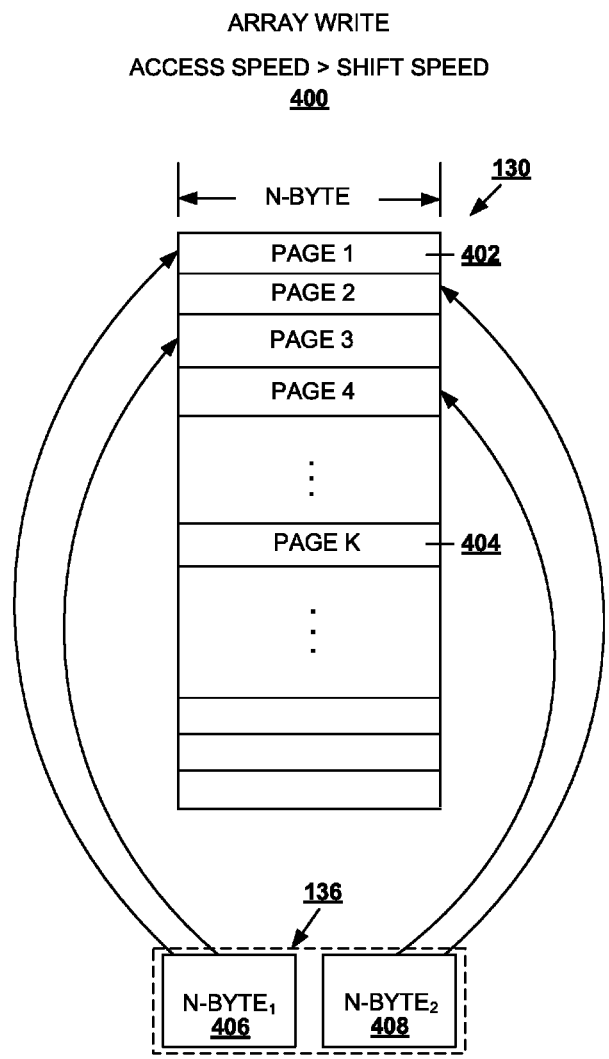
FIG. 4 depicts a diagram of an example array write for a disclosed memory device, in an embodiment.

FIG. 4 illustrates a block diagram of an example array write 400 operation in one or more alternative or additional embodiments of the present disclosure. Particularly, array write 400 can be implemented for a memory device 100 having access speed>shift speed.

Array write 400 employs a sequence of pages of two-terminal memory cell array 130, stacked vertically (e.g., as a column of a two-dimensional matrix). Because access speed (speed with which data is transferred from page buffer 136 to two-terminal memory cell array 130) is faster than shift speed (speed with which a host transfers data to page buffer 136), K=2 buffer subsets are sufficient for page buffer 136. As a result, in response to a first page of data being received at n-byte$_1$ 406, contents of n-byte$_1$ 406 can be written to page 1 402. While the first page of data is being written to page 1 402, a second page of data can be shifted to n-byte$_2$ 408, and after which the second page of data is written to a subsequent page (e.g., page 2) of two-terminal memory cell array 130. This can be completed until a final page of data, e.g., page K, is written to page K 404 of two-terminal memory cell array 130. Because access speed is faster than shift speed, an emulation page size of page buffer 136 can be virtually any size, since data received from a host can be written to two-terminal memory cell array 130 before subsequent data is received from the host.

Figure 5:
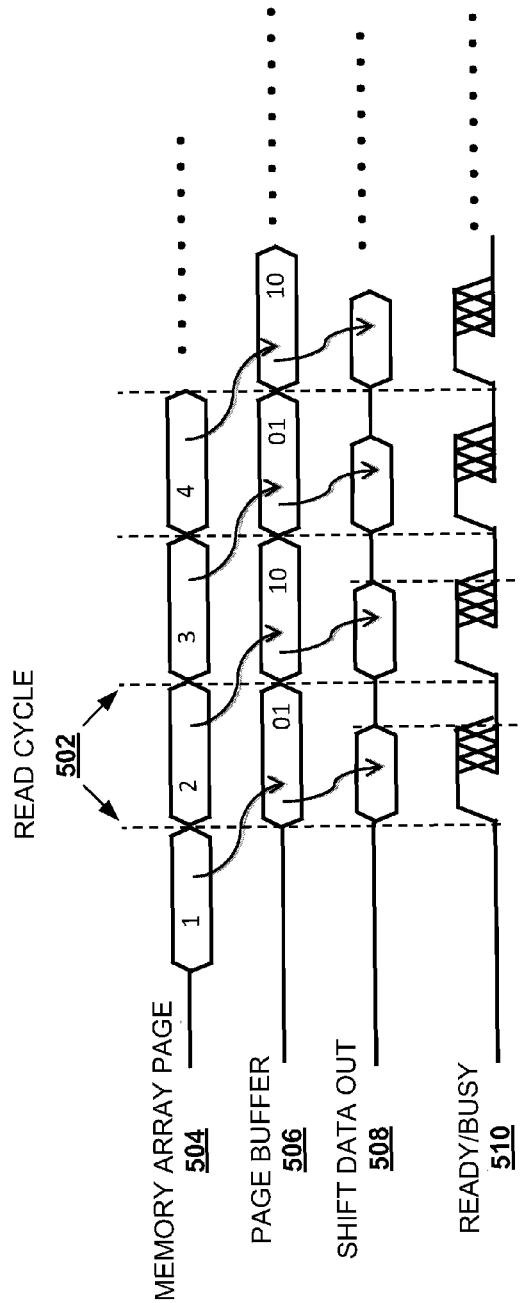
FIG. 5 illustrates an example timing diagram for a memory read operation in a further embodiment.

FIG. 5 illustrates a diagram of an example set of timing signals 500 for an example read operation according to embodiments of the present disclosure. Timing signals 500 are configured for a memory device 100 having an access speed slower than a shift speed. A read cycle 502 is depicted as a benchmark for timing signals 500, and is set to be about equal to the access time for a page of memory. Respectively, timing signals 500 illustrate a memory array page access signal 504, page buffer write signal 506, host data shift signal 508, and a ready/busy signal 510. Because time to transfer data from the memory array to the page buffer is longer than time to transfer data out from the page buffer to the host, ready/busy signal 510 is deactivated after completion of a shift time cycle, until a current access time cycle is completed. Subsequent access time cycles, shift time cycles, and ready/busy signal activation begin concurrently with each read period 502.

Deactivation of ready/busy signal 510 indicates to a host or controller 120 that page buffer 136 does not have valid data to be transferred. In an embodiment, controller 120 can sample ready/busy signal 510 upon completion of reading a previous page buffer subset. This enables controller 120 to know whether a subsequent page buffer subset has valid data. By determining in advance whether valid data exists for the subsequent page buffer, the controller 120 can mitigate or avoid reading/writing invalid data, and associated errors. When valid data is available in the subsequent page buffer subset, memory device 100 can assert ready/busy signal 510 to indicate existence of valid data. The asserting/de-asserting of ready/busy signal 510 can repeat until page buffer 136, or an emulated page buffer, is read. In addition to avoiding reading of invalid data, ready/busy signal 510 can facilitate reduced latency, by informing controller 120 of the existence of valid data to be read from page buffer 136. Note that in the event of an emulated page size that is larger than page buffer 136, a subsequent buffer subset can wrap-around, so to speak, from N-Byte$_K$ back to N-Byte$_1$, and so forth. In at least one configuration for read cycle 502, a maximum of two page buffer subsets are required, or K=2, in which data is read from two-terminal memory cell array 130 and transferred to a host with alternating page buffer subsets.

Figure 6:
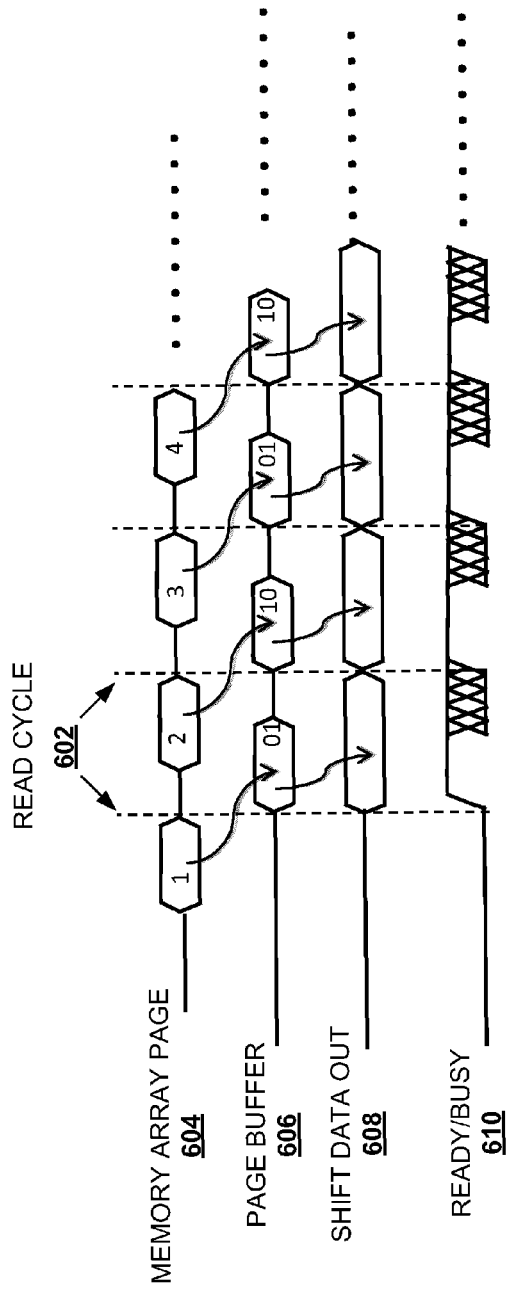
FIG. 6 depicts a sample timing diagram for a memory read operation in yet another embodiment.

FIG. 6 illustrates a diagram of a sample set of timing signals 600 for an example array read operation, according to alternative or additional embodiments. Timing signals 600 can be configured for a memory device 100 having an access speed that is faster than an associated shift speed. Read cycles 602 are depicted that are equal to the shift time for a page of memory. Timing signals 600 include a memory array page access signal 604, page buffer write signal 606, host data shift signal 608 and ready/busy signal 610. Data can be read from an array page in less than a read cycle 602, and transferred to buffer subset in a subsequent read cycle 602. Contents of a buffer subset can be shifted out in respective read cycles 602 as well. Ready/busy signal can remain high since data written to page buffer subsets is completed before contents of a prior buffer subset is shifted out.

Figure 7:
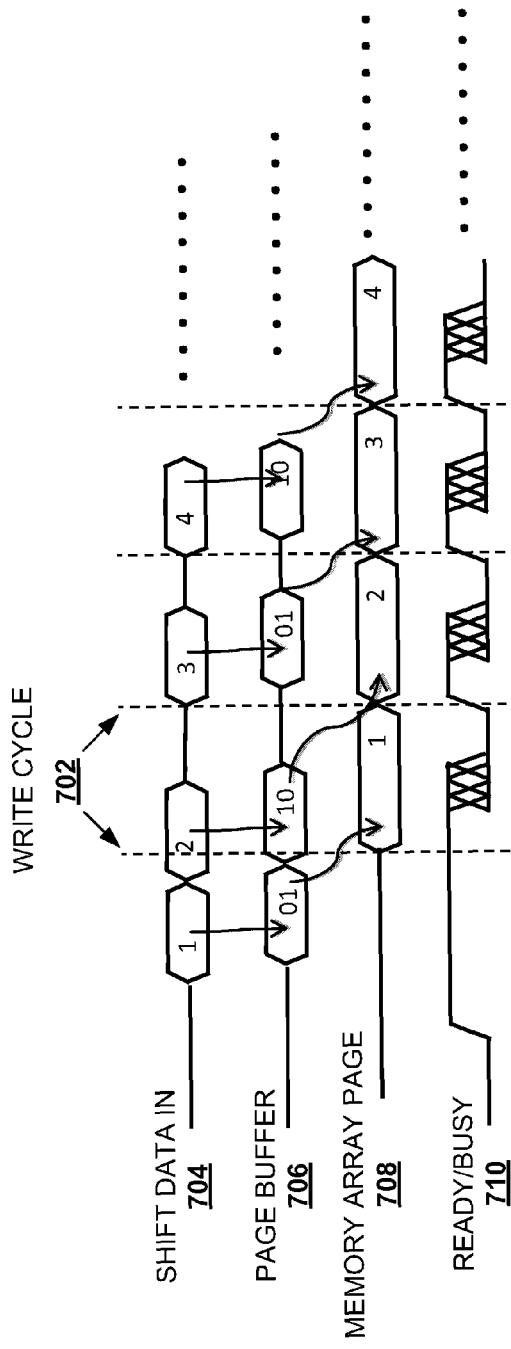
FIG. 7 illustrates a sample timing diagram for a memory write operation in an embodiment.

FIG. 7 depicts a diagram of an example set of timing signals 700 for an example array write operation, in further embodiments. Timing signals 700 can be configured for a memory device 100 having a shift write speed from a host into a page buffer that is faster than an access write speed from the page buffer into the memory device. From a timing perspective, such a memory device 100 can be characterized as having a smaller shift time than access time. As depicted, timing signals 700 include a host data shift signal 704, page buffer write signal 706, array page write signal 708 and ready/busy signal 710. A first page of array data is written to a first page buffer subset in a first write cycle 702, and a second page of array data can be initiated during the first write cycle 702 and completed in a second write cycle 702. Contents of the first page buffer subset are shifted out during the second write cycle 702, enabling a third page of array data to be written to the first buffer subset in a third write cycle 702, in which contents of the second page buffer subset are shifted out to a host device, and so on. It should be noted that, where memory device 100 is emulating a larger page buffer, timing signals 700 can be repeated for each multiple of the emulated page buffer (e.g., similar to that described at FIG. 5, supra).

Figure 8:
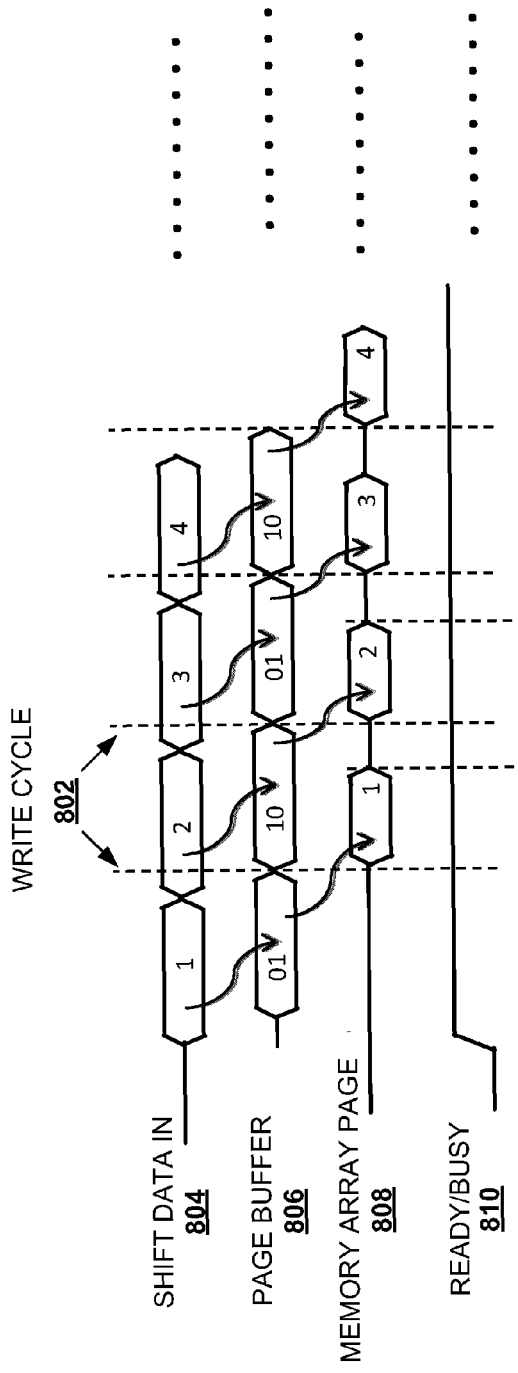
FIG. 8 depicts a sample timing diagram for a memory write operation in an additional embodiment.

FIG. 8 depicts a diagram of a sample set of timing signals 800 for an example array write operation according to still other embodiments. Timing signals 800 can be configured for a memory device having an access speed that is faster than a shift speed, or in the context of timing, an access time that is smaller than a shift time. Timing signals 800 are segmented into write cycles 802, and include host data shift signal 804, page buffer write signal 806, array page write signal 808 and ready/busy signal 810. Array accesses can be shifted with respect to write cycles 802, enabling data to be written to respective page buffer subsets consistent with start and end times of respective write cycles 802. Data received in a page buffer subset in a first write cycle 802 can be shifted out to a host device at the start of a subsequent write cycle. Note that host data shift signal 804 can be advanced slightly forward of write cycle segments 802, so that a subsequent data shift signal 804 (e.g., in the $2^{nd}$ write cycle segment 802 from the left) begins approximately after completion of an array page write 804 in a given write cycle segment 802.

FIG. 9 illustrates a block diagram of an example page size emulation 900 according to one or more additional embodiments of the present disclosure. Page size emulation 900 can be configured to emulate a page buffer that is a multiple, M, times larger than a physical page buffer 136 of a memory device 100. Page buffer 136 can receive respective pages of data, each page having N-bytes, in respective ones of K page buffer subsets, as indicated by the upper page buffer 136, for a total of K pages of data. After one or more page buffer subsets are cleared of existing data, subsequent data, starting with n-byte$_{K+1}$, can be received at a first page buffer subset. In some embodiments, the K+1$^{th}$ byte can be received as soon as existing data in the first page buffer subset is written or shifted out; whereas in other embodiments, the K+1$^{th}$ byte can be received after the J$^{th}$ byte is written or shifted out (e.g., where data input to page buffer 136 can be received faster than the data can be written out from page buffer 136).

Following the K+1$^{th}$ byte, additional bytes can be received at page buffer 136 up to page 2*K. At such point, a second instance of data 136A has been received at page buffer 136. This second instance of data can be included as part of the emulated page size. This can be repeated for as many instances, M, of K pages of data, up to an M$^{th}$ instance of data 136B has been received at page buffer 136. Page M*K can be a final page of data included as the emulated page size, after which a new emulated page can be initiated repeating again at N-byte$_1$ of a first instance of data of page buffer 136.

FIGS. 10A and 10B depict diagrams of example page buffers read and write pointers, respectively, according to further disclosed embodiments. Referring first to FIG. 10A, a page buffer 136 can comprise K page buffer subsets, as depicted. Pages of data respectively comprising n-bytes are read into respective page buffer subsets, starting with n-byte$_1$, . . . , including n-byte$_J$, n-byte$_{J+1}$, . . . through n-byte$_{K-1}$, and n-byte$_K$. If data from page buffer 136 is shifted out, beginning with n-byte$_1$, only after n-byte$_K$ is received, it can be presumed that valid data is contained in each of the page buffer subsets, and no data error will occur at a host device receiving the shifted data (e.g., an under run error, in which data shifted out is not valid). However, this can result in a read latency equal to K times the read access time to read data from K pages of the memory array into page buffer 136 plus a shift time to provide the data to the host device. Shortening the read latency can be achieved by shifting out n-byte$_1$ before waiting to receive n-byte$_K$. To ensure that valid data is received in a given page buffer subset prior to shifting that data out, a page buffer subset, J, can be determined for which data for page buffer subsets J+1 through K are received at page buffer 136 before pages 1 through K−1, at pointer Y, are shifted out, if data shift to host is initiated only after receipt of data at page buffer subset J. As described above at FIG. 3, the value of J can be determined from the number of page buffer subsets K, read access time, and shift time and programmed into read pointer 308. Page buffer 130 will receive J n-bytes of data from memory array 130 in response to a read command. Non-volatile memory 150 can assert a ready/busy signal to inform controller 120 that valid data is ready for reading from page buffer 136. Meanwhile, page buffer 136 continues receiving remaining data from the two-terminal memory cell array 130 as data is being shifted out of the controller 120.

Referring now to FIG. 10B, a page buffer 136, having K page buffer subsets, is again depicted. For a write operation, data is shifted into page buffer 136 starting with n-byte$_1$ through n-byte$_K$. A time to fill page buffer 136 with data is equal to a shift time. Further, a time to write n-byte$_1$ through n-byte$_K$ to K pages of the array is equal to a write access time. In some embodiments, a full shift time can be waited before target pages of a memory array are accessed, and contents of the respective page buffer subsets are written to respective pages of the array. In this case, a write latency is equal to the shift time plus K times the write access time. This write latency can be shortened by writing contents of a page buffer subset to the memory array before all K buffer subsets are full (and as early as a first page buffer subset is full). Thus, n-byte$_1$ can be written to the memory array while a second page buffer subset is receiving data from a host. If the second page buffer subset has not received all the data, non-volatile memory 150 can wait until sufficient data is received.

Where more than K pages of data are expected to be received (e.g., when page buffer 136 is emulating a larger page buffer), there is a risk of overloading page buffer 136 (e.g., where the shift time for the K+ pages of data is faster than associated write access time); that is, where page buffer 136 is receiving data from a host device faster than it is transferring the received data into the memory array 130, page buffer 136 can become overloaded. In a case where the non-volatile memory 150 is emulating a larger page size than physically present in page buffer 136, controller 120 can inadvertently over-write data in the page buffer 136 that has not yet been transferred to two terminal memory cell array 130. As such, non-volatile memory 150 should de-assert the ready/busy signal (e.g., ready/busy low) when no subsets of page buffer 136 are available to store data. Controller 120 can sample the ready/busy signal following data transfer from a page buffer subset, to determine whether valid data is present. If, for instance, data is shifted to fill page buffer 136 through n-byte$_K$, and page buffer 136 can complete writing data up to n-byte$_J$ at that time, a write pointer can be set at point X. After filling page buffer 136, the host can continue shifting data up to the write pointer X without overwriting data. Total write time can therefore be reduced without overloading buffer 136.

Figure 11:
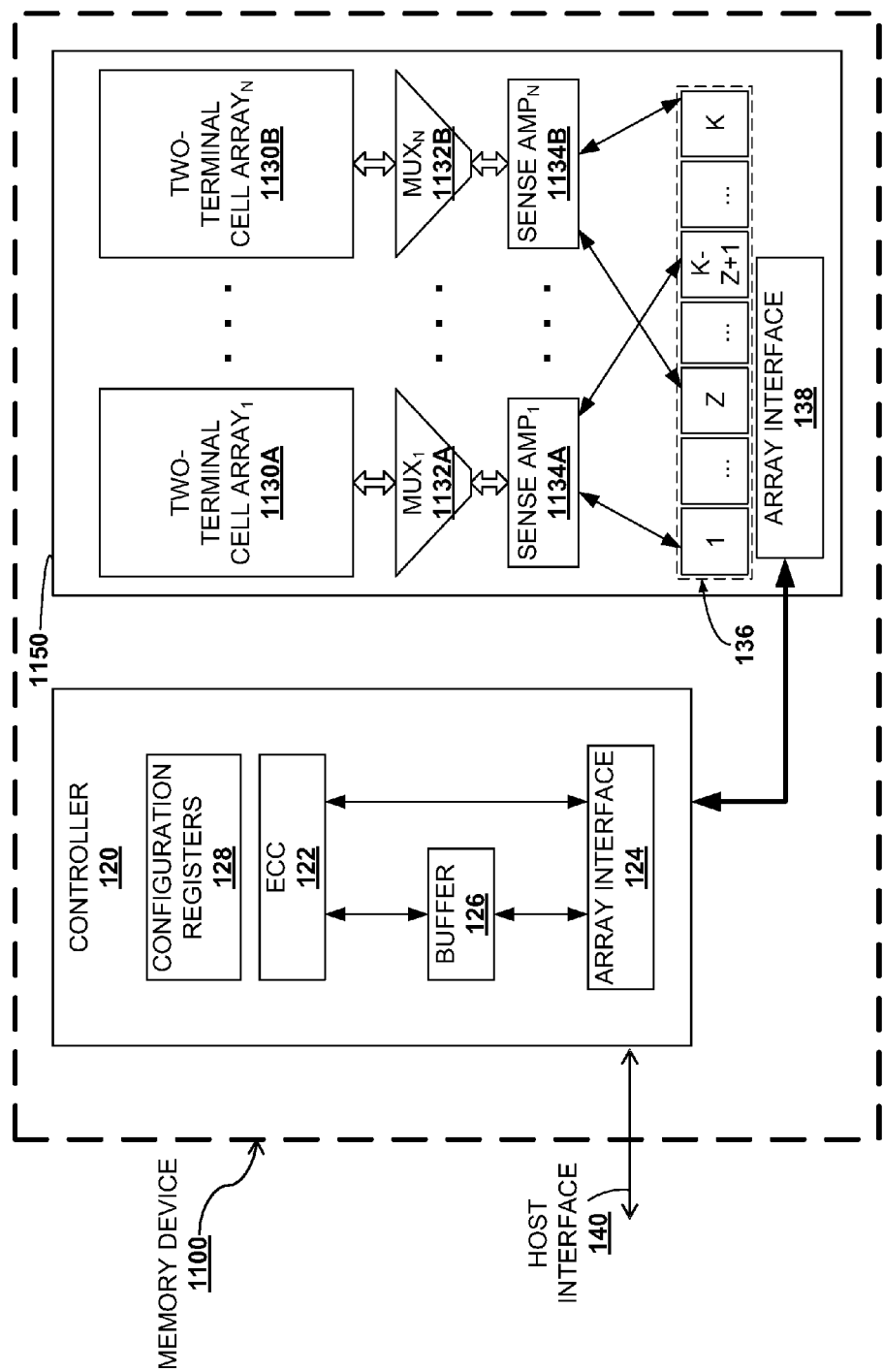
FIG. 11 depicts a block diagram of a sample multi-bank memory device configured for improved data management in additional embodiments.

FIG. 11 illustrates a block diagram of an example multi-bank memory device 1100 according to further disclosed embodiments. Multi-bank memory device 1100 can comprise a controller 120 and a non-volatile memory 1150. Controller 120 can be substantially similar to controller 120 of FIG. 1, supra, in some embodiments, having configuration registers 128, ECC 122, an array interface 124 and buffer 126 to facilitate ECC operation. In at least one embodiment, however, controller 120 can be modified as needed to operate with a non-volatile memory 1150 comprising multiple banks of memory.

Commands received over a host interface 140 are decoded by controller 120 and implemented at non-volatile memory 1150. Additionally, data to be written to non-volatile memory 1150 and data to be read out from non-volatile memory 1150 can be received/provided over host interface 140. Communication with non-volatile memory 1150 can be through a suitable array interface 138. A page buffer 136 can comprise multiple page buffer subsets, which can be receive or output data independently of other page buffer subsets. In an embodiment, page buffer 136 can have a number, K, of page buffer subsets.

Non-volatile memory 1150 can comprise multiple banks of memory, including two-terminal cell array$_1$ 1130A, . . . , two-terminal cell array$_N$ 1130B (referred to collectively as two-terminal cell arrays 1130A-1130B), where N is a suitable positive integer greater than one. As depicted by FIG. 11, respective ones of two-terminal cell arrays 1130A-1130B can comprise a mux and a set of sense amps. Thus, sense amp$_1$ 1134A and mux$_1$ 1132A are operable with two-terminal memory cell array$_1$ 1130A, through sense amp$_N$ 1134B and mux$_N$ 1132B being operable with two-terminal cell array$_N$ 1130B.

Respective two-terminal cell arrays 1130A-1130B can exchange data with subsets of page buffer 136 independently, enabling concurrent memory processing among multiple banks of memory (called interleaving). Interleaving data among multiple memory banks can effectively reduce access times for non-volatile memory 1150, by reading or writing subsets of data at multiple banks of memory. Thus, as an example, a first page buffer subset can read/write data to/from two-terminal cell array$_1$ 1130A, a second page buffer subset can read/write data to/from two-terminal cell array$_N$ 1130B, and so on, through page buffer subset K (and starting again at the first page buffer subset, given sufficient data).

Figure 12:
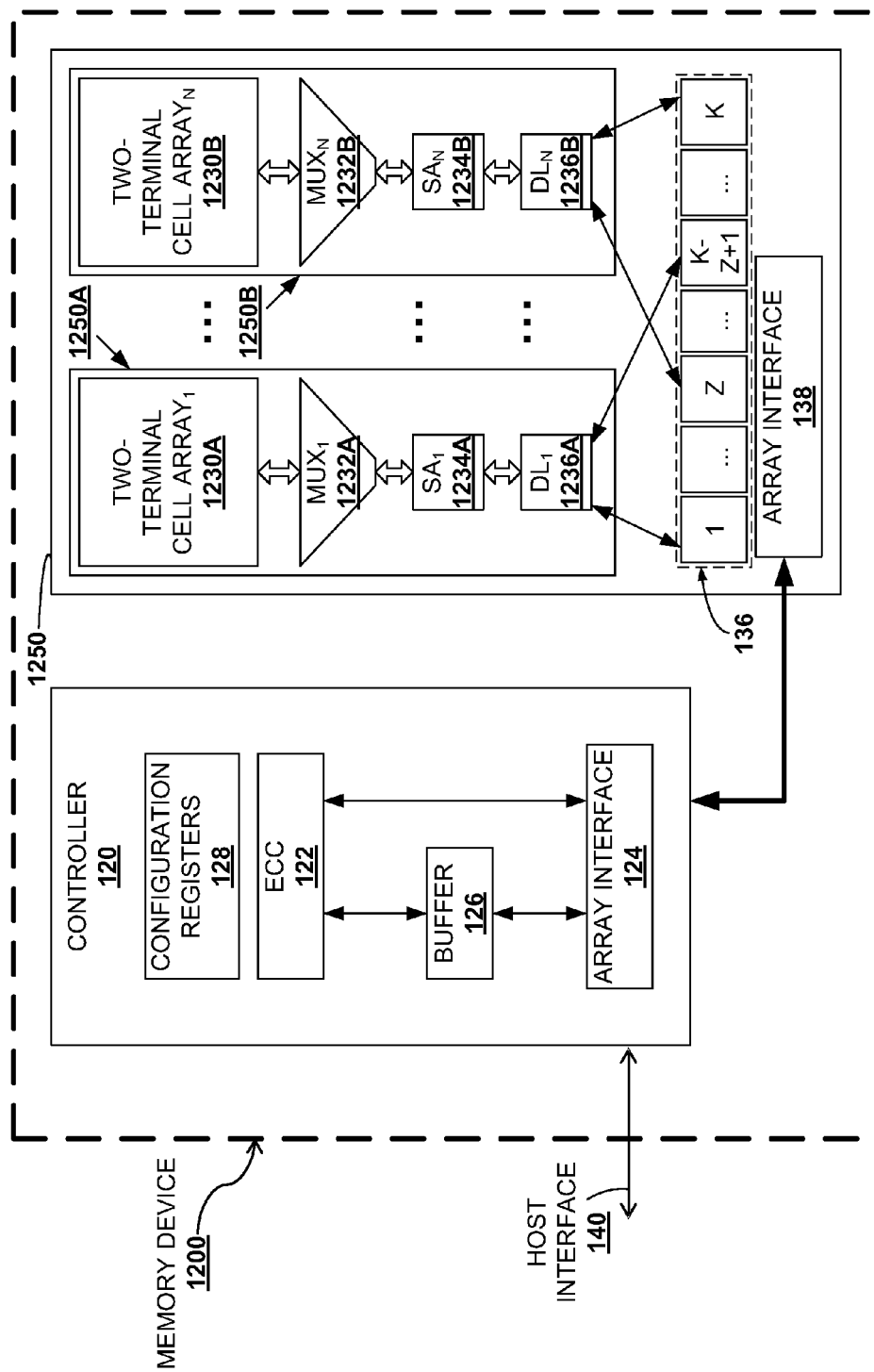
FIG. 12 illustrates a block diagram of an example multi-bank memory device configured for improve data management in further embodiments.

FIG. 12 illustrates a block diagram of a multi-bank memory device 1200 according to alternative or additional embodiments of the present disclosure. Similar to multi-bank memory device 1100 of FIG. 11, supra, multi-bank memory device 1200 can comprise a controller communicatively connected to a host interface 140. Controller also communicates with a non-volatile memory 1250 via an array interface 1138.

In addition to the foregoing, multi-bank memory device 1200 can comprise multiple macro devices (e.g., multiple memory banks) that interface to a common page buffer via respective data latches. As depicted, non-volatile memory 1250 comprises a first macro device 1250A through an N$^{th}$ macro device 1250B, where N is a suitable positive integer greater than one. Respective macro devices comprise a mux 1232A, 1232B, a set of sense amps 1234A, 1234B, and respective data latches 1236A, 1236B. Macro devices 1250A, 1250B can interface with page buffer 136 independently through respective data latches 1236A, 1236B. Accordingly, data can be exchanged between macro device 1250A and a first page buffer subset at least in part concurrent with exchange of additional data between macro device 1250B and a second page buffer subset. Similarly to that described above with respect to non-volatile memory 1150 of FIG. 11, contents of respective page buffer subsets can be interleaved among the macro devices 1250A, 1250B, to achieve higher array performance, reducing overall memory access times and improving read and write latencies.

In one or more embodiments of the present disclosure, the number of memory banks: N, can depend on (e.g., be a function of) the host interface 140 and read or write access time(s) of the array.

In another embodiment(s), the number of page buffer subsets: K, in page buffer 136 match (or is equal to) the number of banks N. When the memory device is emulating a page buffer that is larger than the actual page buffer 136, data latches 1236A through 1236B can hold data being read from non-volatile memory 1250, until data in corresponding data buffer subsets is transferred.

In other embodiments, data from page buffer 136 and array interface 138 is directly transferred to the host interface 140.

In yet another embodiment of the disclosure, data from data latches 1236A through 1236B is directly transferred to the host interface 140.

Figure 13:
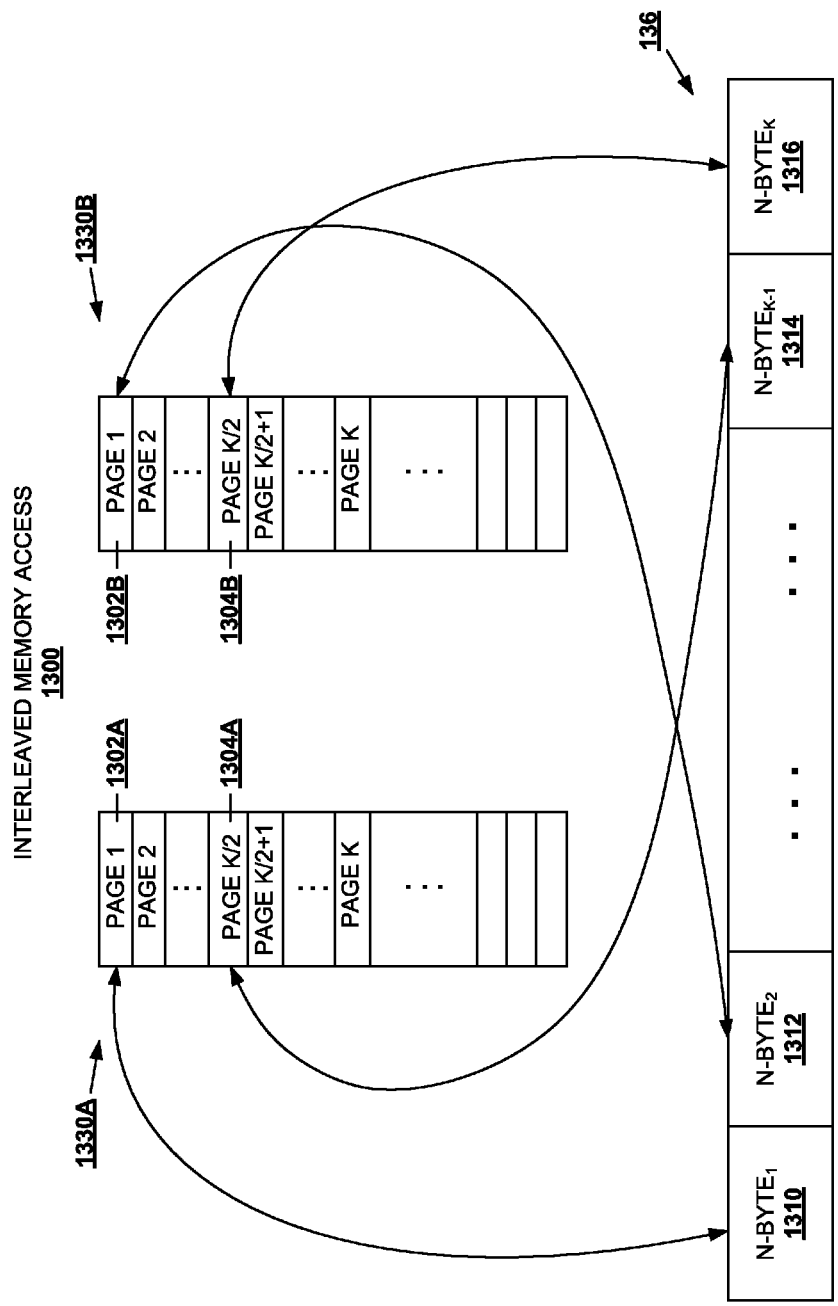
FIG. 13 depicts a block diagram of data transfer from a page buffer to respective banks of a multi-bank memory device, in an embodiment(s)

FIG. 13 illustrates a diagram of an example interleaved memory access 1300 according to further embodiments of the subject disclosure. Interleaved memory access 1300 can be utilized for transferring data between a page buffer 136 and multiple memory banks of a memory device. In one embodiment, interleaved memory access 1300 can be implemented for multiple banks implemented on a single macro device (e.g., see non-volatile memory 1150 of FIG. 11, supra), and in another embodiment, interleaved memory access 1300 can be implemented for multiple macro devices having respective memory banks and data latches (e.g., see non-volatile memory 1250 of FIG. 12, supra).

Columns of multiple pages of memory are depicted for a first memory bank 1330A and for a second memory bank 1330B. It should be appreciated however, that interleaved memory access 1300 can be performed for larger numbers of memory banks, such as three, four, eight, sixteen memory banks, and so on. Page buffer 136 comprises multiple page-size subsets, including a first subset 1310, second subset 1312 through a K-1$^{th}$ subset 1314 and a K$^{th}$ subset 1316 (referred to collectively as page buffer subsets 1310-1316). For a read operation, respective pages of data are read from respective memory banks 1330A, 1330B into respective page buffer subsets 1310-1316. For a write operation, the reverse is true; respective pages of data can be written from respective page buffer subsets 1310-1316 into pages of respective memory banks 1330A, 1330B. For the example depicted by interleaved memory access 1300, n-byte$_1$ from first subset 1310 can be written to/read from page 1 1302A of memory bank 1330A, and n-byte$_2$ from second subset 1312 can be written to/read from page 1 1302B of memory bank 1330B. This process can be repeated for the remainder of K pages of data, so that n-byte$_{K-1}$ 1314 is written to/read from page K/2 1304A of memory bank 1330A, and n-byte$_K$ 1316 is written to/read from page K/2 1304B of memory bank 1330B. Further multiples of K pages of data can likewise be interleaved among further respective pages of memory banks 1330A, 1330B. Thus, a K+1$^{th}$ page of data can be written to/read from page K/2+1 of memory bank 1330A, and a K+2$^{th}$ page of data can be written to/read from page K/2+1 of memory bank 1330B, and so on, until a 2K$^{th}$ page of data is written to/read from page K of memory bank 1330B.

The aforementioned diagrams have been described with respect to interaction between several components of an electronic device, a memory, a controller, or memory array. It should be appreciated that in some suitable alternative aspects of the subject disclosure, such diagrams can include those controllers, devices, arrays, etc., specified therein, some of the specified controllers/devices/arrays, or additional controllers/devices/arrays. Sub-components can also be implemented as connected to other sub-components rather than included within a parent component. For example, multiple memory banks can be provided on separate memory chips, instead of on a single chip. Additionally, it is noted that one or more disclosed processes can be combined into a single process providing aggregate functionality. Components of the disclosed devices/arrays can also interact with one or more other components not specifically described herein but known by those of skill in the art.

Figure 14:
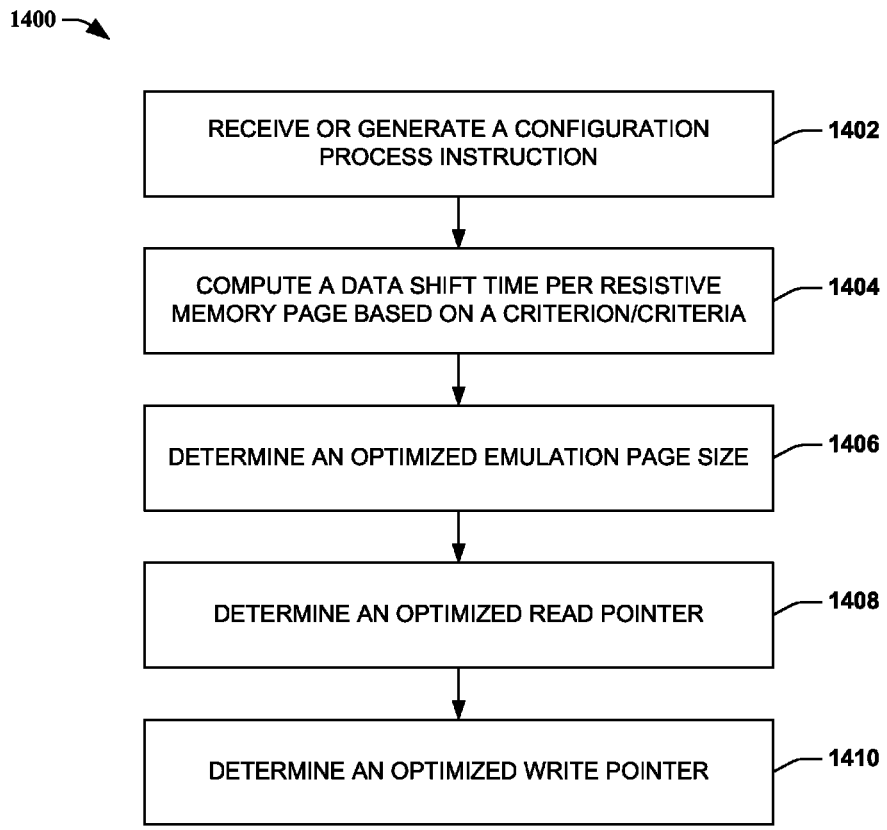
FIG. 14 illustrates a flowchart of an example method for configuring a memory device to emulate a disparate page size in additional embodiments.
Figure 15:
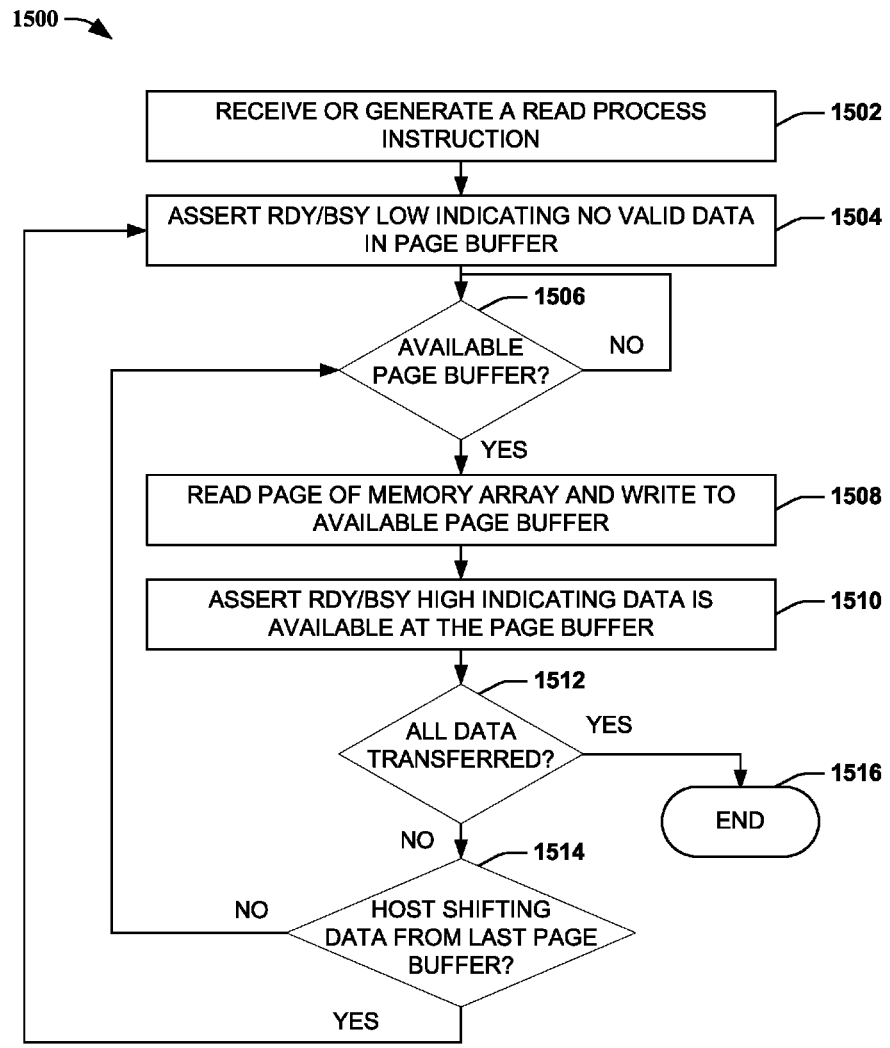
FIG. 15 depicts a flowchart of a sample read operation for a disclosed memory device in other embodiments.

In view of the exemplary diagrams described supra, process methods that can be implemented in accordance with the disclosed subject matter will be better appreciated with reference to the flow charts of FIGS. 14-15. While for purposes of simplicity of explanation, the methods of FIGS. 14-15 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 14 illustrates a flowchart of a sample method 1400 for configuring a memory device according to additional embodiments of the present disclosure. At 1402, method 1400 can comprise receiving or generating a configuration process instruction. The configuration process instruction can be received from a host device, and decoded and implemented, in one embodiment. In an alternative embodiment, the configuration process instruction can be generated by controller logic and implemented according to the controller logic. At 1404, method 1400 can comprise computing a data shift time per resistive memory page, based on one or more criterion. The data shift time can be determined from a transfer rate of an interface over which data is shifted to or from a host, as one example. At 1406, method 1400 can comprise determining an optimal emulation page size. In at least one embodiment, the optimal emulation page size can be set to a default page size of the host, or can be a multiple of physical page buffer size of a memory device, or other suitable emulation page size. At 1408, method 1400 can comprise determining an optimized read pointer position. The read pointer position can be determined from a ratio of the shift time and an access time of the memory device, in some embodiments, satisfying one or more read constraints (e.g., a constraint that maintains valid data in the physical page buffer to be shifted out to the host). At 1410, method 1400 can comprise determining an optimized write pointer position. The write pointer position can be determined from a ratio of the shift time and an access time of the memory device, in some embodiments, satisfying one or more write constraints (e.g., a constraint that mitigates or avoids overloading the physical page buffer size, or the like). Additionally, method 1400 can comprise configuring the memory device according to the emulation page size, optimized read pointer, and optimized write pointer for one or more memory operations.

FIG. 15 illustrates a flowchart of an example method 1500 for reducing read latency for a memory device, according to one or more embodiments. At 1502, method 1500 can comprise receiving or generating a read process instruction. At 1504, method 1500 can comprise asserting a ready/busy low signal indicating no valid data in a page buffer. At 1506, method 1500 can comprise determining whether a page buffer subset is available for receiving data. If a page buffer subset is available, method 1500 can proceed to 1508; otherwise method 1500 repeats reference number 1506.

At 1508, method 1500 can comprise reading data from a page of a memory array and writing the data to the available page buffer subset. At 1510, method 1500 can comprise asserting a ready/busy high signal indicating valid data is available at the page buffer. At 1512, a determination is made as to whether all data being read is transferred from the memory array to the page buffer. If all data is transferred, the memory device has completed the read command and method 1500 can end at 1516; otherwise, method 1500 can proceed to 1514, where method 1500 can comprise determining whether a controller is shifting data from a last page buffer subset holding valid data. If the controller is not shifting data from the last page buffer subset, indicating that there are more page buffer subsets with valid data, method 1500 can return to 1506; otherwise, method 1500 can return to 1504.

Figure 16:
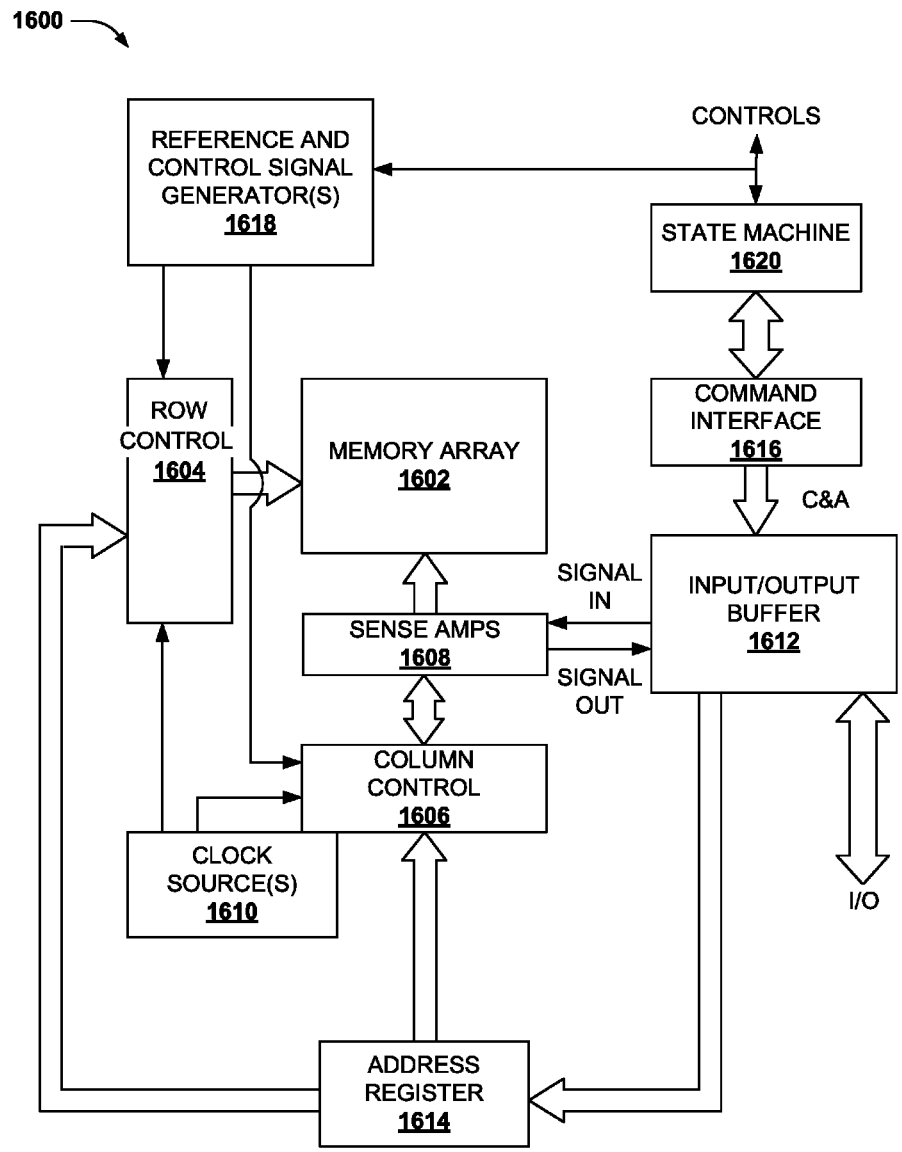
FIG. 16 depicts a block diagram of an example operating and control environment for a memory device according to disclosed embodiments.

FIG. 16 illustrates a block diagram of an example operating and control environment 1600 for a memory array 1602 of a memory cell array according to aspects of the subject disclosure. In at least one aspect of the subject disclosure, memory array 1602 can comprise memory selected from a variety of memory cell technologies. In at least one embodiment, memory array 1602 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1606 and sense amps 1608 can be formed adjacent to memory array 1602. Moreover, column controller 1606 can be configured to activate (or identify for activation) a subset of bit lines of memory array 1602.

Column controller 1606 can utilize a control signal provided by a reference and control signal generator(s) 1618 to activate, as well as operate upon, respective ones of the subset of bitlines, applying suitable program, erase or read voltages to those bitlines. Non-activated bitlines can be kept at an inhibit voltage (also applied by reference and control signal generator(s) 1618), to mitigate or avoid bit-disturb effects on these non-activated bitlines.

In addition, operating and control environment 1600 can comprise a row controller 1604. Row controller 1604 can be formed adjacent to and electrically connected with word lines of memory array 1602. Also utilizing control signals of reference and control signal generator(s) 1618, row controller 1604 can select particular rows of memory cells with a suitable selection voltage. Moreover, row controller 1604 can facilitate program, erase or read operations by applying suitable voltages at selected word lines.

Sense amps 1608 can read data from, or write data to the activated memory cells of memory array 1602, which are selected by column control 1606 and row control 1604. Data read out from memory array 1602 can be provided to an input/output buffer 1612. Likewise, data to be written to memory array 1602 can be received from the input/output buffer 1612 and written to the activated memory cells of memory array 1602.

A clock source(s) 1608 can provide respective clock pulses to facilitate timing for read, write, and program operations of row controller 1604 and column controller 1606. Clock source(s) 1608 can further facilitate selection of word lines or bit lines in response to external or internal commands received by operating and control environment 1600. Input/output buffer 1612 can comprise a command and address input, as well as a bidirectional data input and output. Instructions are provided over the command and address input, and the data to be written to memory array 1602 as well as data read from memory array 1602 is conveyed on the bidirectional data input and output, facilitating connection to an external host apparatus, such as a computer or other processing device (not depicted, but see e.g., computer 1102 of FIG. 11, infra).

Input/output buffer 1612 can be configured to receive write data, receive an erase instruction, receive a status or maintenance instruction, output readout data, output status information, and receive address data and command data, as well as address data for respective instructions. Address data can be transferred to row controller 1604 and column controller 1606 by an address register 1610. In addition, input data is transmitted to memory array 1602 via signal input lines between sense amps 1608 and input/output buffer 1612, and output data is received from memory array 1602 via signal output lines from sense amps 1608 to input/output buffer 1612. Input data can be received from the host apparatus, and output data can be delivered to the host apparatus via the I/O bus.

Commands received from the host apparatus can be provided to a command interface 1616. Command interface 1616 can be configured to receive external control signals from the host apparatus, and determine whether data input to the input/output buffer 1612 is write data, a command, or an address. Input commands can be transferred to a state machine 1620.

State machine 1620 can be configured to manage programming and reprogramming of memory array 1602 (as well as other memory banks of a multi-bank memory array). Instructions provided to state machine 1620 are implemented according to control logic configurations, enabling state machine to manage read, write, erase, data input, data output, and other functionality associated with memory cell array 1602. In some aspects, state machine 1620 can send and receive acknowledgments and negative acknowledgments regarding successful receipt or execution of various commands. In further embodiments, state machine 1620 can decode and implement status-related commands, decode and implement configuration commands, and so on.

To implement read, write, erase, input, output, etc., functionality, state machine 1620 can control clock source(s) 1608 or reference and control signal generator(s) 1618. Control of clock source(s) 1608 can cause output pulses configured to facilitate row controller 1604 and column controller 1606 implementing the particular functionality. Output pulses can be transferred to selected bit lines by column controller 1606, for instance, or word lines by row controller 1604, for instance.

In connection with FIG. 17, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 17:
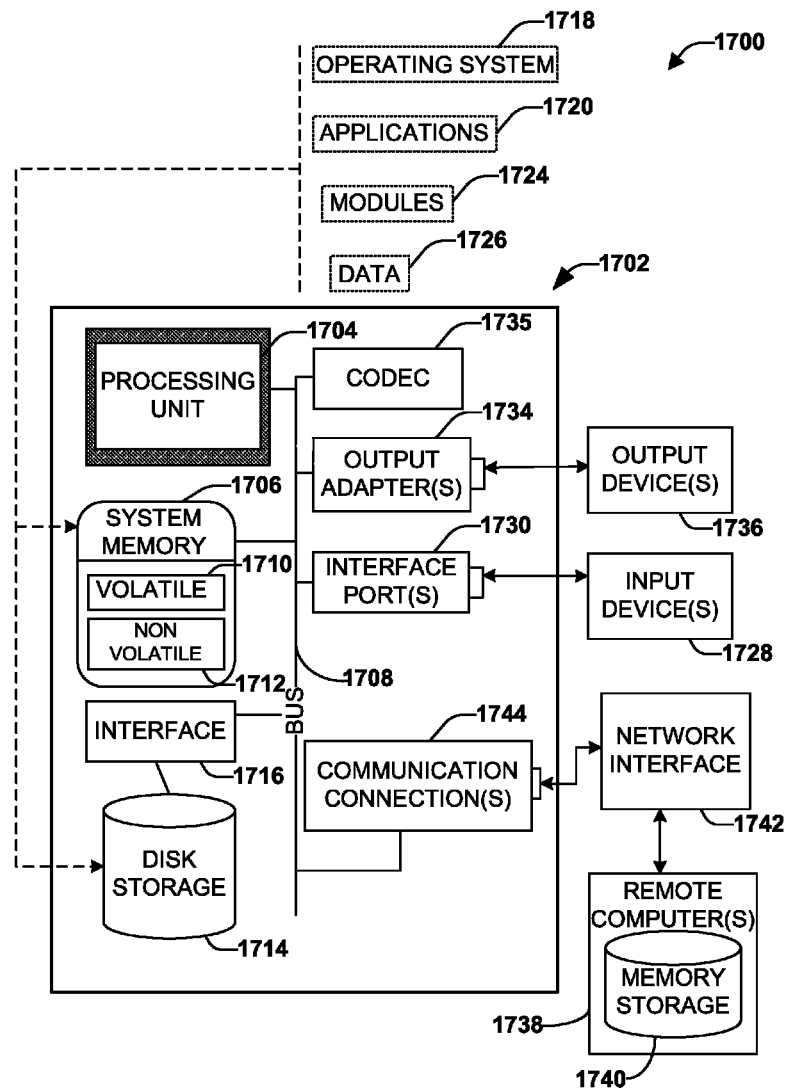
FIG. 17 illustrates a block diagram of an example computing environment that can be implemented in conjunction with various embodiments.

With reference to FIG. 17, a suitable operating environment 1700 for implementing various aspects of the claimed subject matter includes a computer 1702. The computer 1702 includes a processing unit 1704, a system memory 1706, a codec 1735, and a system bus 1708. The system bus 1708 communicatively inter-connects system components including, but not limited to, the system memory 1706 to the processing unit 1704. The processing unit 1704 can be any of various available processors. Dual microprocessors and other multiprocessor architectures also can be employed as the processing unit 1704.

The system bus 1708 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1706 includes volatile memory 1710 and non-volatile memory 1714, which can employ one or more of the disclosed memory architectures, in various embodiments. The basic input/output system (BIOS), containing the basic routines to transfer information between elements within the computer 1702, such as during start-up, is stored in non-volatile memory 1712. In addition, according to present innovations, codec 1735 may include at least one of an encoder or decoder, wherein the at least one of an encoder or decoder may consist of hardware, software, or a combination of hardware and software. Although, codec 1735 is depicted as a separate component, codec 1735 may be contained within non-volatile memory 1712. By way of illustration, and not limitation, non-volatile memory 1712 can include read only memory (ROM), programmable ROM (PROM), electrically programmable ROM (EPROM), electrically erasable programmable ROM (EEPROM), Flash memory, or two-terminal memory (e.g., resistive-switching memory). Non-volatile memory 1712 can employ one or more of the disclosed memory architectures, in at least some disclosed embodiments. Moreover, non-volatile memory 1712 can be computer memory (e.g., physically integrated with computer 1702 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1710 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1702 may also include removable/non-removable, volatile/non-volatile computer storage medium. FIG. 17 illustrates, for example, disk storage 1714. Disk storage 1714 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1714 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1714 to the system bus 1708, a removable or non-removable interface is typically used, such as interface 1716. It is appreciated that disk storage 1714 can store information related to a user. Such information might be stored at or provided to a server or to an application running on a user device. In one embodiment, the user can be notified (e.g., by way of output device(s) 1736) of the types of information that are stored to disk storage 1714 and/or transmitted to the server or application. The user can be provided the opportunity to opt-in or opt-out of having such information collected and/or shared with the server or application (e.g., by way of input from input device(s) 1728).

It is to be appreciated that FIG. 17 describes software that acts as an intermediary between users and the basic computer resources described in the suitable operating environment 1700. Such software includes an operating system 1718. Operating system 1718, which can be stored on disk storage 1714, acts to control and allocate resources of the computer 1702. Applications 1720 take advantage of the management of resources by operating system 1718 through program modules 1724, and program data 1726, such as the boot/shutdown transaction table and the like, stored either in system memory 1706 or on disk storage 1714. It is to be appreciated that the claimed subject matter can be implemented with various operating systems or combinations of operating systems.

A user enters commands or information into the computer 1702 through input device(s) 1728. Input devices 1728 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1704 through the system bus 1708 via interface port(s) 1730. Interface port(s) 1730 include, for example, a serial port, a parallel port, a game port, and a universal serial bus (USB). Output device(s) 1736 use some of the same type of ports as input device(s) 1728. Thus, for example, a USB port may be used to provide input to computer 1702 and to output information from computer 1702 to an output device 1736. Output adapter 1734 is provided to illustrate that there are some output devices, such as monitors, speakers, and printers, among other output devices, which require special adapters. The output adapter 1734 can include, by way of illustration and not limitation, video and sound cards that provide a means of connection between the output device 1736 and the system bus 1708. It should be noted that other devices and/or systems of devices provide both input and output capabilities such as remote computer(s) 1738.

Computer 1702 can operate in a networked environment using logical connections to one or more remote computers, such as remote computer(s) 1738. The remote computer(s) 1738 can be a personal computer, a server, a router, a network PC, a workstation, a microprocessor based appliance, a peer device, a smart phone, a tablet, or other network node, and typically includes many of the elements described relative to computer 1702. For purposes of brevity, only a memory storage device 1740 is illustrated with remote computer(s) 1738. Remote computer(s) 1738 is logically connected to computer 1702 through a network interface 1742 and then connected via communication connection(s) 1744. Network interface 1742 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1744 refers to the hardware/software employed to connect the network interface 1742 to the system bus 1708. While communication connection 1744 is shown for illustrative clarity inside computer 1702, it can also be external to computer 1702. The hardware/software necessary for connection to the network interface 1742 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of configuring a memory device, comprising:
receiving a configuration process instruction for generating respective values for a set of operational parameters for a non-volatile, two-terminal memory device;
computing a data shift time indicative of an amount of time required for transferring a first amount of data from the non-volatile, two-terminal memory device to a host device, and setting the computed data shift time as a value for a shift time parameter of the set of operational parameters;
determining an emulation page size for an emulated page buffer and setting the emulation page size as a value of an emulation page size parameter of the set of operational parameters;
determining a read pointer position from a ratio of the value of the shift time parameter and an access time of the non-volatile, two-terminal memory device;
determining a write pointer position from the ratio of the value of the shift time parameter and the access time, and from the value of the emulation page size parameter; and
performing an array operation on the non-volatile, two-terminal memory device in response to a host command utilizing the read pointer position or the write pointer position, for a second amount of data equal to the value of the emulation page size parameter, wherein the second amount of data exceeds a physical page buffer size of the non-volatile, two-terminal memory device.

2. The method of claim 1, wherein performing the array operation comprises writing the second amount of data equal to the emulation page size parameter to the non-volatile, two-terminal memory device in response to a single host write operation.

3. The method of claim 2, wherein writing the second amount of data to the non-volatile, two-terminal memory device further comprises interleaving subsets of the second amount of data among multiple memory banks of the non-volatile, two-terminal memory device.

4. The method of claim 1, wherein performing the array operation comprises reading the second amount of data equal to the emulation page size parameter from the non-volatile, two-terminal memory device and outputting the second amount of data in response to a single host read operation.

5. The method of claim 4, wherein reading the second amount of data from the non-volatile, two-terminal memory device further comprises aggregating subsets of the second amount of data from multiple memory banks of the non-volatile, two-terminal memory device.

6. The method of claim 1, wherein determining the emulation page size further comprises determining the emulation page size as a multiple of a physical page buffer size of the non-volatile, two-terminal memory device.

7. The method of claim 1, wherein determining the read pointer position further comprises determining the read pointer position to satisfy at least one read constraint.

8. The method of claim 1, wherein determining the write pointer position further comprises determining the write pointer position to satisfy at least one write constraint.

9. A memory device, comprising: an array of non-volatile, two-terminal memory cells; and a memory controller configured to:
receiving a configuration process instruction for generating respective values for a set of operational parameters for the memory device;
compute a data shift time indicative of an amount of time required for transferring a first amount of data from the memory device to a host device, and setting the computed data shift time as a value for a shift time parameter of the set of operational parameters;
determine an emulation page size for an emulated page buffer and setting the emulation page size as a value of an emulation page size parameter of the set of operational parameters;
determine a read pointer position from a ratio of the value of the shift time parameter and an access time of the device;
determine a write pointer position from the ratio of the value of the shift time parameter and the access time, and from the value of the emulation page size parameter;
and perform an array operation on a portion of the non-volatile, two-terminal memory cells in response to a host command utilizing the read pointer position or the write pointer position, for a second amount of data equal to the value of the emulation page size parameter, wherein the second amount of data exceeds a physical page buffer size of the memory device.

10. The electronic memory of claim 9, wherein the memory controller is further configured to perform the array operation comprising write the second amount of data equal to the emulation page size parameter to the at least one non-volatile, two-terminal memory device in response to a single host write operation.

11. The electronic memory of claim 10, wherein the memory controller is further configured to write the second amount of data to the at least one non-volatile, two-terminal memory device further comprising interleave subsets of the second amount of data among multiple memory banks of the non-volatile, two-terminal memory cells.

12. The electronic memory of claim 9, wherein the memory controller is further configured to perform the array operation comprising read the second amount of data equal to the emulation page size parameter from the memory device and outputting the second amount of data in response to a single host read operation.

13. The electronic memory of claim 12, wherein the memory controller is further configured to read the second amount of data from the memory device further comprising aggregate subsets of the second amount of data from multiple memory banks of the non-volatile, two-terminal memory cells.

14. The electronic memory of claim 9, wherein the memory controller is further configured to determine the emulation page size further comprising determine the emulation page size as a multiple of a physical page buffer size of the non-volatile, two-terminal memory device.

15. The electronic memory claim 9, wherein the memory controller is further configured to determine the read pointer position further comprising determine the read pointer position to satisfy at least one read constraint.

16. An electronic memory, comprising:
at least one non-volatile, two-terminal memory device; and
a memory controller configured to:
receiving a configuration process instruction for generating respective values for a set of operational parameters for the at least one non-volatile, two-terminal memory device;

compute a data shift time indicative of an amount of time required for transferring a first amount of data from the at least one non-volatile, two-terminal memory device to a host device, and setting the computed data shift time as a value for a shift time parameter of the set of operational parameters;

determine an emulation page size for an emulated page buffer and setting the emulation page size as a value of an emulation page size parameter of the set of operational parameters;

determine a read pointer position from a ratio of the value of the shift time parameter and an access time of the non-volatile, two-terminal memory device;

determine a write pointer position from the ratio of the value of the shift time parameter and the access time, and from the value of the emulation page size parameter; and perform an array operation on the at least one non-volatile, two-terminal memory device in response to a host command utilizing the read pointer position or the write pointer position, for a second amount of data equal to the value of the emulation page size parameter, wherein the second amount of data exceeds a physical page buffer size of the non-volatile, two-terminal memory device.

17. The electronic memory of claim 16, wherein memory controller is further configured to perform the array operation comprises write the second amount of data equal to the emulation page size parameter to the at least one non-volatile, two-terminal memory device in response to a single host write operation.

18. The electronic memory of claim 17, wherein the memory controller is further configured to write the second amount of data to the at least one non-volatile, two-terminal memory device further comprising interleave subsets of the second amount of data among multiple memory banks of the non-volatile, two-terminal memory device.

19. The electronic memory of claim 16, wherein the memory controller is further configured to perform the array operation comprising read the second amount of data equal to the emulation page size parameter from the at least one non-volatile, two-terminal memory device and outputting the second amount of data in response to a single host read operation.

20. The electronic memory of claim 19, wherein the memory controller is further configured to read the second amount of data from the at least one non-volatile, two-terminal memory device further comprising aggregate subsets of the second amount of data from multiple memory banks of the at least one non-volatile, two-terminal memory device.

* * * * *